United States Patent

Varadarajan et al.

[11] Patent Number: 5,838,583
[45] Date of Patent: Nov. 17, 1998

[54] OPTIMIZED PLACEMENT AND ROUTING OF DATAPATHS

[75] Inventors: Ravi Varadarajan, Fremont; Robert Thompson, Los Gatos, both of Calif.

[73] Assignee: Cadence Design Systems, Inc., San Jose, Calif.

[21] Appl. No.: 631,828

[22] Filed: Apr. 12, 1996

[51] Int. Cl.⁶ .................................................. G06F 17/50
[52] U.S. Cl. ................................. 364/491; 364/488
[58] Field of Search .................................. 364/488, 489, 364/490, 491

[56] References Cited

U.S. PATENT DOCUMENTS

| | | | |
|---|---|---|---|
| 4,630,219 | 12/1986 | DiGiacomo et al. | 364/488 |
| 4,670,846 | 6/1987 | Laws | 364/490 |
| 4,754,408 | 6/1988 | Carpenter et al. | 364/491 |
| 4,951,221 | 8/1990 | Corbett et al. | 364/489 |
| 4,964,056 | 10/1990 | Bekki et al. | 364/488 |
| 5,359,538 | 10/1994 | Hui et al. | 364/491 |
| 5,461,577 | 10/1995 | Shaw et al. | 364/491 |
| 5,487,018 | 1/1996 | Loos et al. | 364/489 |
| 5,491,640 | 2/1996 | Sharma et al. | 364/488 |
| 5,506,788 | 4/1996 | Cheng et al. | 364/491 |
| 5,515,293 | 5/1996 | Edwards | 364/489 |
| 5,519,627 | 5/1996 | Mahmood et al. | 364/488 |
| 5,521,836 | 5/1996 | Hartoog et al. | 364/491 |
| 5,557,532 | 9/1996 | Jun et al. | 364/491 |
| 5,586,047 | 12/1996 | Imahashi | 364/491 |
| 5,587,923 | 12/1996 | Wang | 364/490 |
| 5,657,243 | 8/1997 | Toyonaga et al. | 364/491 |

OTHER PUBLICATIONS

Cai, H., Note, S., Six, P. and De Man, H., "A Data Path Layout Assembler for High Performance DSP Circuits", 27th ACM/IEEE Design Automation Conference, Paper 18.1, pp. 306–311, 1990.

*Primary Examiner*—Kevin J. Teska
*Assistant Examiner*—Leigh Marie Garbowski
*Attorney, Agent, or Firm*—Fenwick & West LLP

[57] ABSTRACT

A computer system, method and software product enables automatic placement and routing of datapath functions using a design methodology that preserves hiearchical and structural regularity in top down designs for datapaths. The system includes a datapath floorplanner, a datapath placer, and routing space estimator. The datapath floorplanner allows the designer to establish and maintain during floorplannning operations datapath regions that include a number of datapath functions each. The datapath floorplanner creates the datapath regions from a netlist specifying logic cell instances and connectivity information, and from a plurality of tile files. A tile file is a structured description of a datapath function, describing the relative vertical and horizontal placement of all logic cell instances within the datapath function. There is one tile file for each unique datapath function. The datapath function instances then are associated with a particular tile file by the tile file list file. The datapath floorplanner uses the tile files to integrate the placement information with the specific function instances, and further allows the specification of clusters, function interleaving, and net side constraints per region. A datapath placer places the datapath functions in each region using the relative placement information and constraints. The routing space estimator estimates the space needed for routing a placed region. All of this information is interactively provided to the circuit designer so as to allow almost real time modification of datapath placement.

31 Claims, 24 Drawing Sheets

OPTIMIZED PLACEMENT AND ROUTING OF DATAPATHS

BACKGROUND

1. Field of Invention

The present invention relates to systems and methods for computer aided design of integrated circuits, and more particularly, to systems and methods for placement and routing of circuit elements.

2. Background of Invention

Today, the prevailing design methodology for integrated circuits is top down design using hardware description languages (HDLs). Using a top down method, the designer creates an integrated circuit by hierarchically defining functional components of the circuit, and then decomposing each component into smaller and smaller components. Two of the primary types of components used in integrated circuits are datapaths and control logic. Control logic, typically random logic, is used to control the operations of datapaths. Datapaths areas of the circuit perform functional operations, such as mathematical or other operations. More particularly, datapaths are typically composed of large numbers of highly regular and structured datapath functions, each datapath function typically including an arrangement of logic cells.

These various components of an integrated circuit are initially defined by their functional operations and relevant inputs and outputs. The designer may also provide basic organizational information about the placement of components in the circuit using floorplanning tools. During these design stages, the designer has structured the circuit using considerable hierarchical information, and has typically provided substantially regularity in the design through the use of datapaths and the like.

From the HDL description, the actual logic cell implementation is determined by logic synthesis, which converts the functional description of the circuit into a specific circuit implementation. The logic cells are then placed (determination of the coordinate location of the logic cells in the circuit layout) and routed (determination of the wiring between logic cells).

Currently, conventional placement and routing systems accept as their input a flattened netlist resulting from the logic synthesis process. This flattened netlist identifies the specific logic cell instances from a target standard cell library, and merely describes the specific cell to cell connectivity.

Unfortunately, the flattened netlist fails to capture any of the hierarchical structure or regularity that was originally provided in the datapaths by the designer. That is, the netlist resulting from logic synthesis merely describes the very lowest level of detail, the connections of logic cells. This is offhandedly known as a "sea of gates." Thus, a conventional placement and routing system, operating only on the "sea-of-gates" netlist, cannot take advantage of any of the hierarchical or structural regularity of the datapath components that the designer originally provided in the HDL and floorplanning stages. Conventional placement and routing system thus place the individual logic cells without any regard as to their association with each other (other than connectivity) in the larger units of the datapath functions and datapath regions of the circuit. As a result, there is significant degradation in both the die-size and performance of datapaths in conventionally placed and routed design.

In some integrated circuits the degradation in performance of datapath regions from automatic placement and routing systems is unacceptable. This is particularly true in mainframe or other high-end microprocessors. As a result, designers of these circuits typically partition the circuit at the HDL level into its datapaths (and other sections with regular structures) and random logic areas. Only the random logic portions of the circuit are optimized by logic synthesis tools and automatic place and route. The datapath regions are usually custom designed using special library cells, rather than the standard cells. The 'datapath core' is then placed and routed manually.

This manual process is extremely time consuming, and increases the time necessary to bring the circuit to market. Time to market is an essential concern in designing electronics systems, whether for consumer goods or industrial applications. In many cases, time to market is a function of how early in the design cycle can the first production circuits be manufactured and tested. This stage of "first silicon" is directly impacted by the speed with which the circuit designer can floorplan, place, and route the circuit.

Accordingly, where time to market is more important than circuit performance, as in low-end ASIC designs, the designers typically use logic synthesis tools, standard cell libraries, and automatic placement and routing to optimize the entire design. While the regularity of datapath portions may be lost and performance degraded, the circuit is produced relatively quickly. Thus, performance suffers, but time to market is reduced.

Accordingly, it is desirable to provide an automatic placement and routing system and method that can utilize and preserve the regularity of datapath sections when placing and routing integrated circuits. It is desirable to provide a system and method that allows the designer to define datapath regions including datapath functions in the circuit and provide this information to a placement system for determining the placement of logic cells in the datapath functions, while preserving the regularity of the datapath. Such a placement and routing system would place and route high performance integrated circuits automatically instead of manually or with custom library cells. As a beneficial result then, a desirable system would provide the circuit performance results approaching custom design and the time to market benefits of automated design systems.

Additionally, in the custom design approach, as the datapath core is usually designed with custom designed datapath cells, it is almost impossible to mix the datapath core with associated control logic. Rather, the datapath core is designed as a rather inpermeable block, and its associated control logic is separately designed as a block. As a result, wiring at the chip level will have to route around the datapath core, thereby increasing wire length and degrading chip performance. Further, because the datapath core is treated as a block, significant area may be left over after custom placement of datapath functions in the datapath core. This wasted area increases the overall size of the chip.

Another problem with conventional placement systems is that they typically may take many hours to complete the placement of the circuit. This time delay, and the fact that they have no ability to determine the placement of datapath regions at the region level, means that the placement process is not interactive. Rather, the designer starts the placement process, and then reviews the results at a much later time. During placement and routing, the router will attempt to route the layout, and will only inform the designer at the end of the process as to whether the routing was possible. If the circuit could not be routed, the process must be repeated after the designer makes changes in the circuit design.

Accordingly, it is desirable to provide a placement and routing system that is interactive, allowing the designer to interactively specify the placement of datapath regions, with the placement and routing system indicating whether the circuit may be routed with the specified placement.

Because conventional placement and routing systems do not capture and utilize structural information about the datapaths, the circuit designer is unable to control their operation in how functions in the datapath are placed. There are three issues designers typically consider when performing layout of a circuit during floorplanning, and during placement. First, the circuit designer may desire to cluster certain datapath functions in a datapath region together in order to achieve critical timing requirements. Second, the circuit designer may also desire to specify particular constraints on the databus and control nets that exit the datapath and couple it to databus and control logic sections, again to optimize performance and area. Third, the circuit designer may desire to change the aspect ration (height to width) of a datapath region in order to fit it into available space on the circuit, or to change the over the cell routing availability. With conventional placement systems, the circuit designer is unable to provide any of these types of constraints to the placer.

Accordingly, it is desirable to provide a placement system that allows the circuit designer to cluster datapath functions, define constraints for net exits, and control the aspect ratio and over the cell routing of the datapath regions.

SUMMARY OF THE INVENTION

In accordance with one aspect of the present invention, there is provided a system and method that automatically places and routes datapaths in integrated circuits while preserving the regularity in the datapath functions, and the floorplanning of the integrated circuit provided by the designer.

A system in accordance with one embodiment of the invention includes a routing space estimator and a datapath placer as components of a software product. The datapath placer and routing space estimator use a conventional netlist, that provides merely a low level structural definition of an integrated circuit without any description of structural regularity, particularly for datapath functions, and one or more "tile files" that describe the relative placement of logic cells within the datapath functions, independent of their particular instantiation within an integrated circuit. By capturing the relative placement of instances within datapath functions, the tile files provide sufficient information to datapath function placer to assemble the datapath function instances into regular structures.

In particular, the tile files allows the datapath placer to optimize the particular ordering, bit alignment, and function stacking of datapath functions, using a number of cost functions. The datapath placer in one embodiment of the present invention uses a modified A* algorithm that optimizes three weighted costs functions for the datapath region: estimated wire length of the placement of datapath functions, estimated overflow tracks of the placement, and estimated wasted space. Estimated wire length is based on the length of signal nets needed to connect a given linear order of the datapath functions. Estimated overflow tracks is likewise based on a given linear order of datapath functions, and on the maximum number of tracks that cross a datapath function within the datapath region, but do not couple to the datapath function, given the linear order. Finally, estimated wasted space is determined from by selecting the bit offset of each datapath function in a given linear order that minimizes the space in which no datapath functions were placed.

The tile files allow the datapath placer to optimize these three cost functions by providing the relative placement information. The tile files further allows the datapath placer to optimize the estimated wasted space cost function by stacking datapath functions on top of each other, rather than merely placing them side by side. Stacking is possible only because the tile files allow for the definition of bit alignment on an individual datapath function basis. The tile file captures sufficient information to allow the datapath placer to optimize estimated overflow tracks because of the ability to specify for each datapath function a number of rows per bit to be used for overcell routing.

The datapath placer operates in conjunction with a routing space estimator. The routing space estimator estimates the amount of routing space needed for routing a given linear ordering of datapath functions in the datapath region.

Because of the structured data representation of datapath regions and datapath functions that the tile files provide to the layout database, it is possible for the circuit designer to perform datapath flooplanning, datapath function placement, and routing space estimation interactively. This enables the circuit designer to investigate many different designs in a short period of time, without having the lengthy revision cycles typical of conventional systems for placement and routing of low level logic cell instances.

DETAILED DESCRIPTION OF THE INVENTION

Overview of the System

Figure 1:
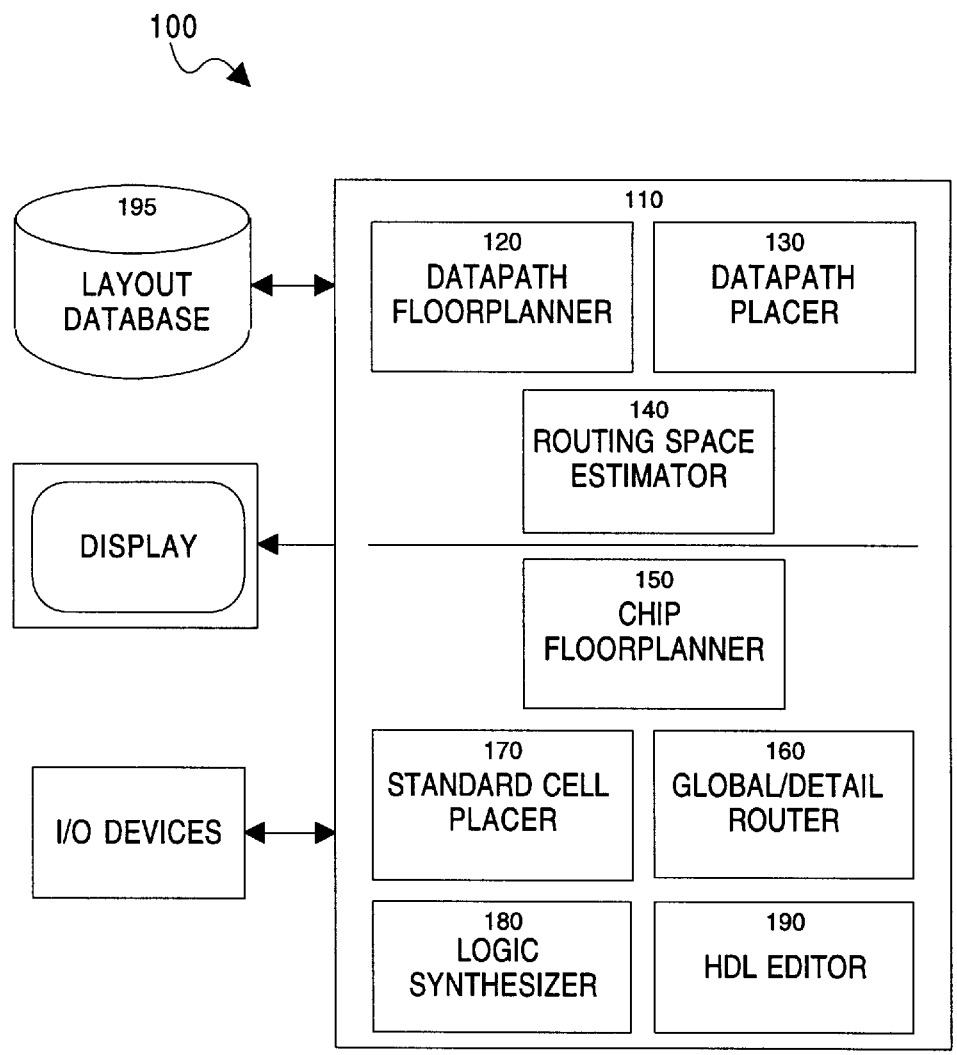
FIG. 1 is an illustration a computer system in accordance with the present invention.

Referring now to FIG. 1, there is shown the software organization of one embodiment of a computer system providing the automatic placement and routing capability of the present invention. System 100 includes a conventional computer 110 having conventional memory, display, and input-output devices. In the memory there is provided in accordance with one embodiment of the present invention a datapath floorplanner 120, a datapath placer 130, and a routing space estimator 140. The datapath floorplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space required for routing the datapath functions, given the placement of such functions by the datapath placer 130.

In support of these components, a conventional chip floorplanner 150, global/detail router 160, standard cell placer 170, logic synthesizer 180, and HDL editor 190 are usefully employed by, but do not form an inherent part of, the present invention.

The computer 110 is conventionally coupled to a mass storage device providing a layout database 195 with which the foregoing components interface. The layout database 195 may be implemented using the EDIF database standard. The operations of the conventional chip floorplanner 150, global/detail router 160, standard cell placer 170, logic synthesizer 180, and HDL editor 190 are conventional. Suitable ones of these elements are Preview, Cell3, QPlace, Synergy, and Verilog, respectively.

Accordingly, a system 100 as illustrated in FIG. 1 is merely an instance of one aspect of the invention.

Figure 3:
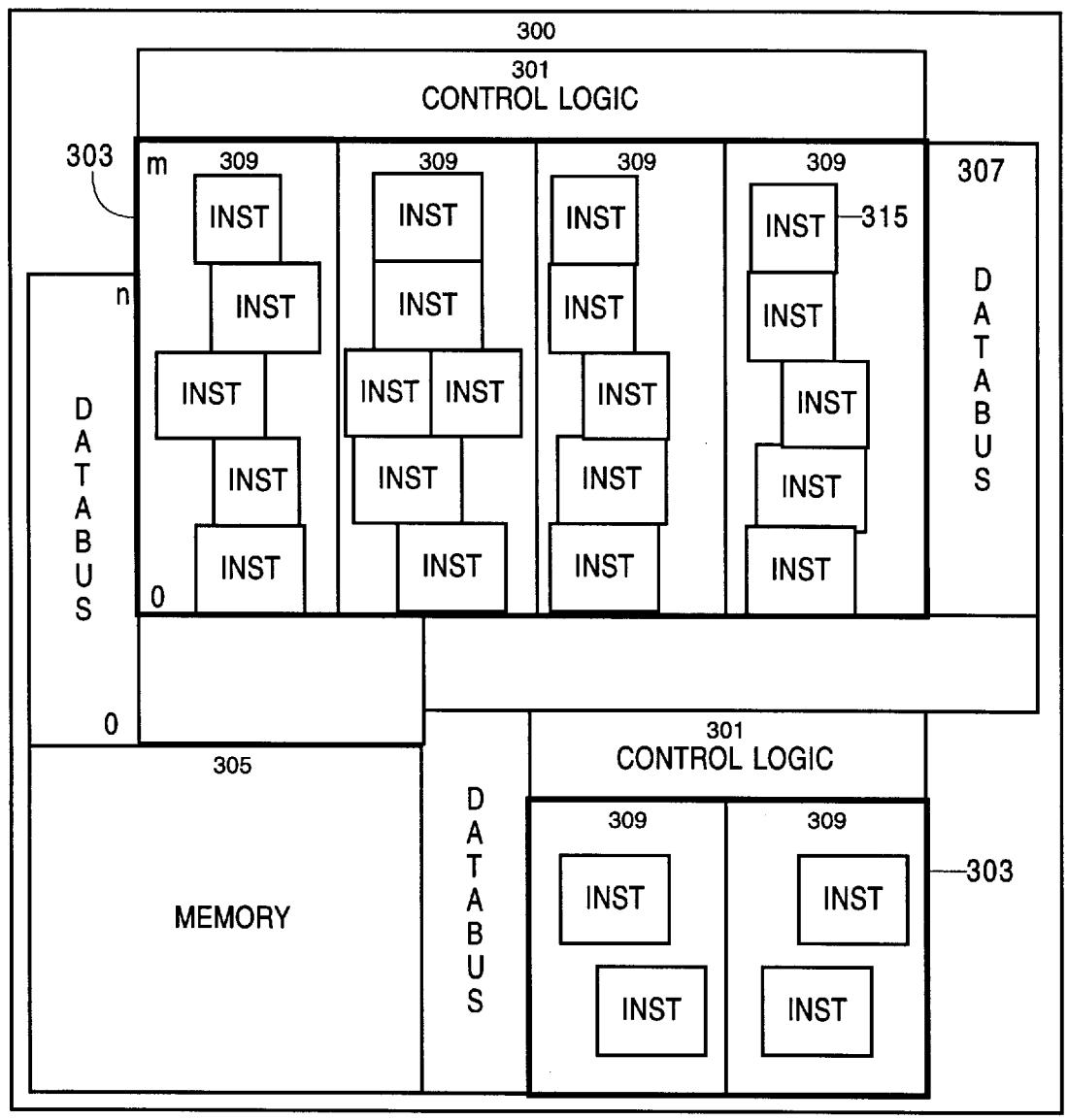
FIG. 3 is a schematic representation of an integrated circuit.

Referring now to FIG. 3, there is shown a schematic illustration of a sample integrated circuit for the purposes of the present invention. An integrated circuit is comprised of a plurality of control regions 301, datapath regions 303, and memory 305. These various regions are interconnected with databuses 307 spanning multiple bits. In most integrated circuits 300, databuses 307 are 16, 32, or 64 bits wide. Each bit in a datapath function has a bit position, ordered from 0 to n−1, where n is less than or equal is the width of the databus 307.

Each datapath region 303 is comprised of a plurality of datapath functions 309. Each datapath function 309 spans multiple bits in a databus 307 that is connected to the datapath region 303. A datapath function 309 may span anywhere from a portion of the bits in the databus 307 to all of the bits in the databus 307. For the purposes of this discussion, it is assumed that datapath functions 309 are vertically aligned, with databuses 307 running horizontally through the datapath functions. A datapath function 309 is comprised a plurality of cell instances 315 which enable some form of signal or logic transformation of the data passed by the databus 307.

The cell instance 315 within a datapath function 309 operates on a range of bit positions 0 to m−1, with m being the width of the datapath function 309. The datapath function width m need not match the width of the databus 307 to which the datapath function is coupled. The first bit of a datapath function 309 is the $0^{th}$ bit. This first bit is aligned with an arbitrary $i^{th}$ bit position in databus 307. This alignment, or "bit offset" must be determined during placement and routing of the datapath region 303. The determination of the bit offset has conventionally been done only by hand or with custom library cells since conventional placers do not recognize datapath functions 309 as placeable entities. The datapath placer 130 of the present invention however, automatically determines the bit offset of each datapath function 309 in its datapath region 303 with respect to the databus 307 associated with the function 309.

Overview of System Operation

Figure 2:
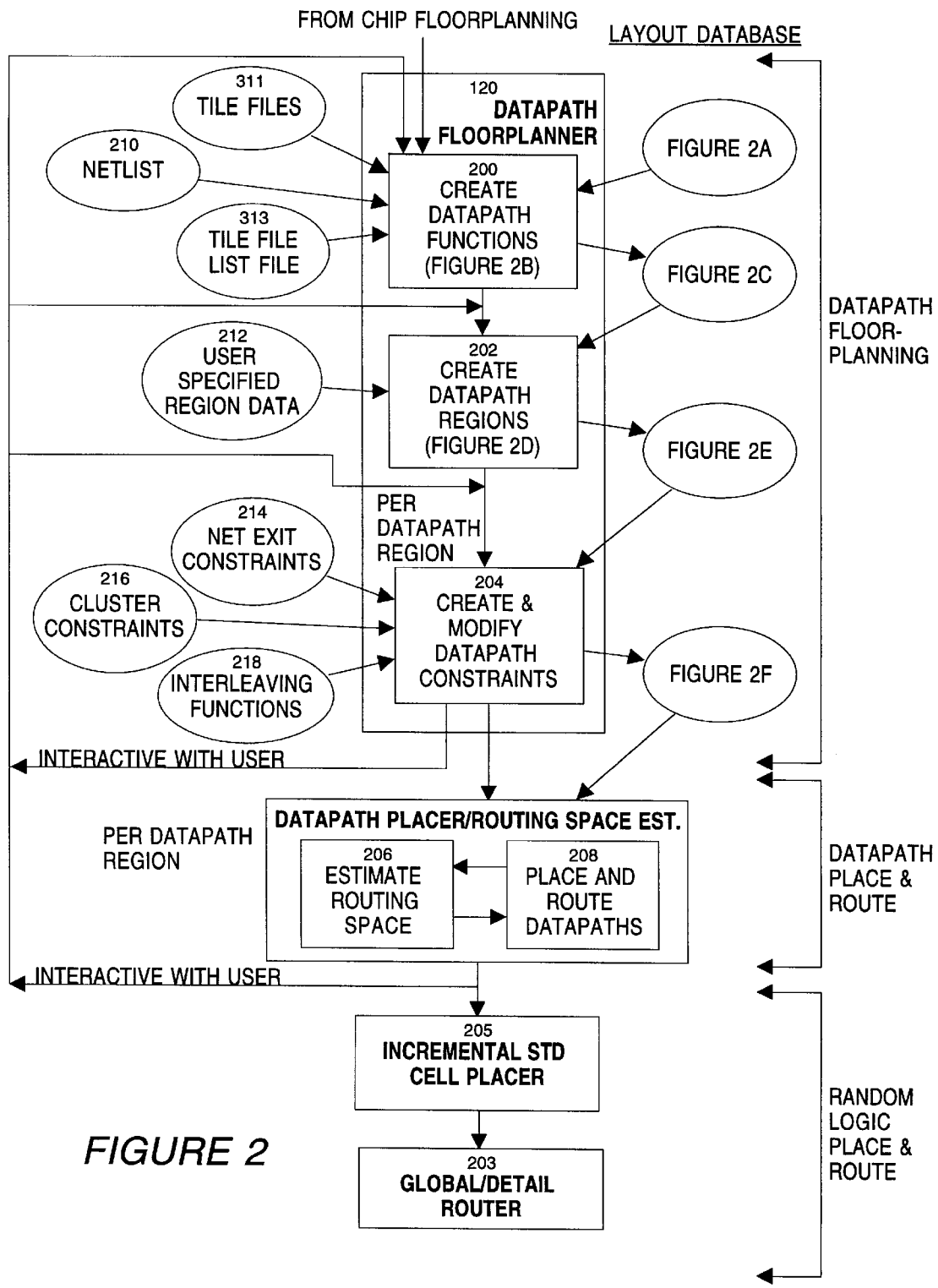
FIG. 2 is a overall dataflow diagram of a method of placing and routing datapaths in accordance with the present invention.

Referring now to FIG. 2, there is shown a flowchart of the overall operation flow of the present invention. This operational flow is itself one aspect of the present invention, separate and apart from the specific software and hardware elements used to implement the operational flow, because it provides for the interactive definition of datapath functions, datapath regions, and various constraints on datapath regions, from which the placement of the datapath function and estimated routing space be determined. This interactive process is contrasted with the time-consuming placement provided by conventional systems that use only standard cell placers, and that do not capture datapath regions and datapath functions as placeable entities.

The operational flow shown in FIG. 2 usally begins after the circuit designer has specified the circuit in HDL (Verilog or VHDL for example), performed logic synthesis to produce a netlist 200, and after basic chip floorplanning has been done with the chip floorplanner 150.

Figure 2A:
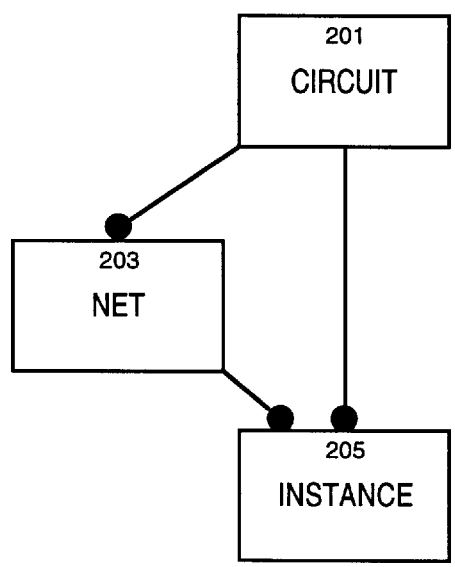
FIG. 2a is an illustration of a schema for a conventional layout database.

The basic schema of a circuit as represented in layout database 195, following logic synthesis, is illustrated in FIG. 2a. The representation of the circuit in the layout database 195 at this stage is conventional. A circuit 201 is comprised of a plurality of instances 203 and a plurality of nets 205. A net 205 interconnects a number of instances 203, by associating pins on each of the instances 203. The various other attributes of a circuit have been suppressed in this model for ease of understanding.

The present invention substantially modifies the schema of the circuit and the information stored in the layout database 195 in order to capture the placement of instances in datapath functions, the placement of datapath functions in datapath regions, and the relative placement of datapath regions in the circuit. The capturing of this information enables the present invention to provide interactive floorplanning of datapath functions within datapath regions.

Create Datapath Functions

Accordingly, the operational flow begins with the circuit designer creating 200 one or more datapath functions. The datapath functions are created by determining from a set of tile files 311 and a tile file list file 313 which logic cell instances in the circuit are associated with which unique datapath functions. To aid in the understanding of this step, a description of the tile files 311 and tile file list file 313 is now provided.

Figure 4:
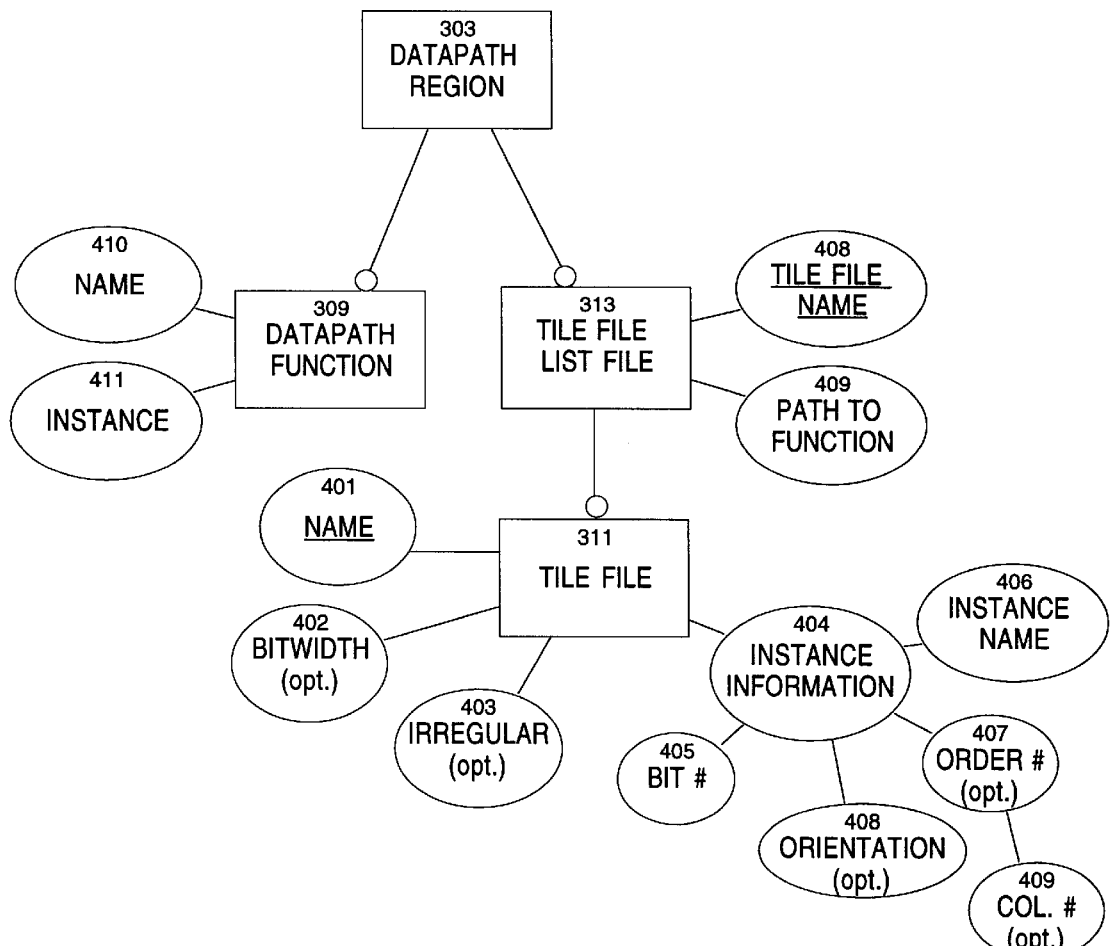
FIG. 4 is an entity-relationship diagram of the tile files, datapath region, datapath functions, and tile file list file

Referring to both FIG. 4 and FIG. 3, in order to determine the placement of each datapath function 309, there are a plurality of tile files 311 associated with circuit 301. Specifically, for each unique datapath function 309 there is a tile file 311 that describes the relative placement of the instances within the datapath function 309. Thus, while there may be many different datapath functions 309 instantiated within a datapath region 303, such datapath functions 309 are instantiated from only a smaller number of unique datapath functions 309. It is for each of these unique datapath functions 309 that there is tile file 311. For example, a datapath region 303 may be comprised for three 16 bit multiplexers and three sixteen bit adders. While there are six datapath functions 309 total, there are only two unique instances, one multiplexer function and one adder function. Thus, there are two tile files 311 for such a datapath region 303.

For every datapath region 303 there is a tile file list file 313 that associates individual datapath functions 309 within the datapath region 303 with a tile file 311 for that datapath function 309. In many cases the tile file list file could be automatically inferred from the design hierarchy. That is, the tile file list file 313 maps a many-to-one relationships between the datapath functions 309 of a datapath region 303 and a set of tile files 311.

The tile files 311 and the tile file list 313 specify sufficient information for the datapath placer 130 to determine the structural hierarchy in the datapath region 303. This allows the datapath placer 130 to place the datapath functions 309 in a manner that preserves the structural regularity in the datapath region 303, thereby yielding improved performance for the integrated circuit.

Tile files 311 are design specific and capture the relative placement of instances with a single datapath function 309, thereby allowing the datapath placer to assemble the instances into a regular structure. More particularly, a tile file 311 specifies for each instance in a single datapath function 309 instance information 404 that specifies a name 406 for the instance, the relative horizontal (column # 409 and order # 407) and vertical position (bit # 405) of the instance, and its orientation 408.

Relative horizontal position is a left-to-right ordering value. For datapath functions 309 with multiple columns, the ordering value indicates both a column and a position within the column. The relative vertical position specifies a bit position 405 relative to the $0^{th}$ bit of the datapath function 309. The orientation 408 specifies a rotation value.

In addition, a tile file 311 specifies the overall bit width 402 of the function, and whether the datapath function 309 is considered to be irregular 403, that is internal random logic. These are optional properties for a tile file 311.

From this information, and the mapping of specific instances of datapath functions 309 in a datapath region 303 to specific tile files 311 via the tile file list file 313, the datapath placer 130 is able to place each datapath region 303 and datapath function 309 within the datapath region 303. This process is further described below.

There are many ways in which the tile files 311 and tile file list file 313 may be implemented, whether through text files, databases, or the like.

In one preferred embodiment, a tile file 311 is an association list of [property, value] pairs. These pairs may be defined as follows:

```
Tile File {
    (functionBitWidth   bitwidth)
    (functionIrregular  value)
    (instanceTileInfo   instanceInformation)
}
```

The functionIrregular and functionBitWidth properties correspond to the irregular 403 and bitwidth 402 attributes. These properties are optional and further described below.

The instanceTileInfo property is a list of all cell instances in the datapath function 309. This is the instance information 404. Each instance is specified by a name 406, and associated with a bit number 405 for the instance within the datapath function 309, a order 407 of the instance with the specified bit, and an orientation 408 of the instance. The instanceInformation may thus, take the following form:

```
instanceTileInfo {
    (<instanceName> <bit#> <order#> <orientation>)
    (<instanceName> <bit#> <order#> <orientation>)
    . . .
}
```

The instanceName is a user specified name 406, and preferably identifies the instance by the same name as used in the netlist. The bit# specifies the bit position relative to the $0^{th}$ bit of the datapath function 309, not the absolute bit within the databus 307 coupled to the datapath function 309.

The order# and orientation are optional. If present, the order# specifies the position of the instance within the bit#$^{th}$ bit. Again, assuming for the purposes of discussion a vertical orientation of datapath functions 309, and horizontal orientation of databuses 307, then the bit# specifies the vertical bit offset of the instance from the $0^{th}$ bit (bottom) of the datapath function 309, and the order# specifies the left to right position of the instance within the bit. If the order# is not specified, it is assumed to be 0.

The orientation specifies the relative rotation of the instance. Acceptable values are R0 (no rotation) and MY (mirrorred about the Y axis) If not specified, orientation is assumed to be R0.

Each tile file 311 has a name 410, preferably of the format <functionname.tile>.

Figure 5:
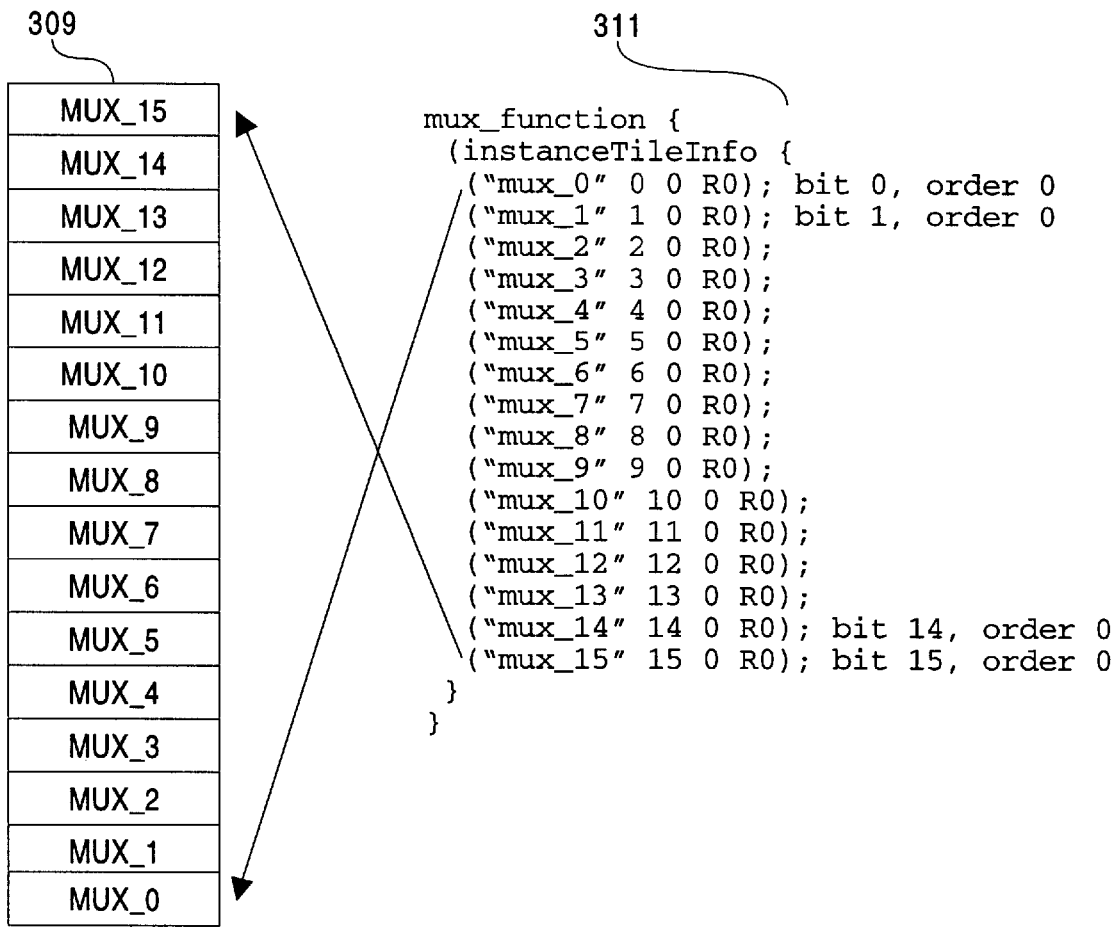
FIG. 5 is an illustration of a one dimensional function and its associated tile file.

A datapath function 309 may be either a one-dimensional function, or a two dimensional function. In a one dimensional function, there is a single column of cell instances. In a two dimensional datapath function 309 there are multiple columns of cell instances. FIG. 5 illustrates a one-dimensional, 16 bit datapath function 309, here a column of multiplexers. A tile file 311 for the datapath function 309 is shown in correspondence to the datapath function. This particular one-dimensional datapath function 309 has only a single instance per column, and is called a vector function. It is possible for a one-dimensional datapath function 309 to have multiple, ordered instances per column.

Where a datapath function 309 has multiple columns, the order number is expanded as a two element list of two integers, column#, 409 which specifies the column number in the datapath function 309, and order# 407 is the order of the instance within the column:

(<instanceName> <bit#> <(column#, order#)> <orientation>)

The order# (whether in a one dimensional or two dimensional datapath function 309) are 0 indexed. Instances in a function are ordered left to right when the datapath function 309 has a normal, R0, orientation, and right to left when the datapath function 309 has a flipped, MY, orientation.

Figure 6A:
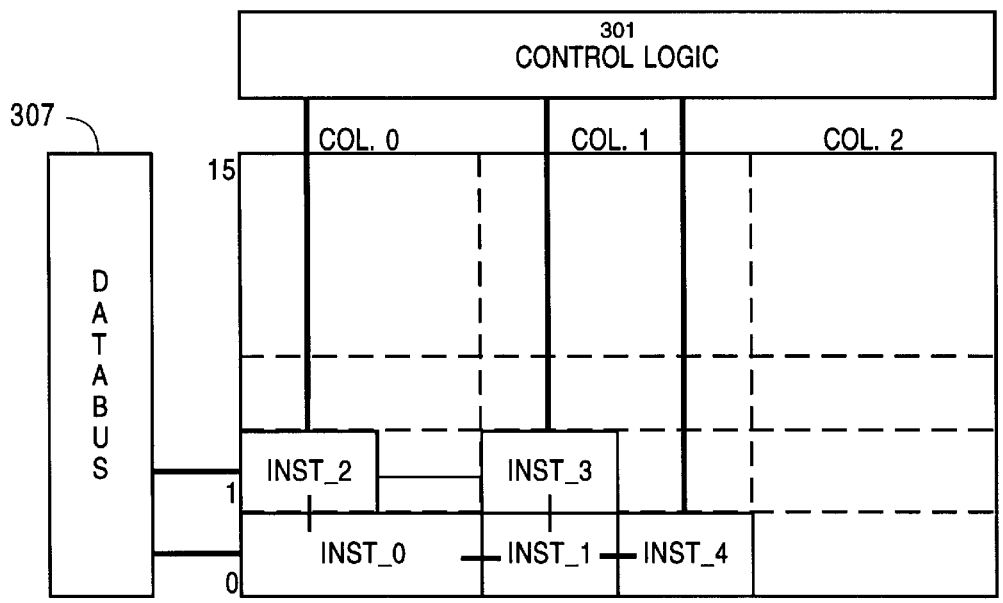
FIG. 6a is an illustration of a two dimensional datapath function.

The ability to specify for each instance, which particular column and order within the column allows the designer to control the vertical align of cell instances with respect to control logic flowing into a datapath function 309. FIG. 6a illustrates a portion of a two dimensional datapath function 309 with multiple columns, columns 0, 1, and 2, and a control logic region 301 associated with the datapath function 309. The datapath function 309 receives data from a databus 307, here 16 bits wide.

In column 0 of the datapath function 309, there are individual instances, INST_0, which is associated with the $0^{th}$ bit of the function, and INST_2, which associated with the $1^{st}$ bit of the datapath function 309. Note that the position of INST_2 leaves some space between itself and the next instance in the bit, INST_3. INST_3 receives a control signal from the control logic 301, which then passes through INST_3 to INST_1. Accordingly, it is desirable to align INST_3 in column 1 in order to reduce the wire length need to route the control signal to INST_1. In a conventional placer, INST_3 would moved over to the left immediately adjacent to INST_2 in an effort to locally minimize area, and as a result, additional wire length would be need to route the control signal. This is because conventional placers, operating only with a "sea of gates" netlist, cannot determine that INST_3 should remain aligned in column 1 with INST_1. However, the present invention overcomes these problems by using the tile file 311 to specify the placement of the instances within columns. In this example, the relative placement of INST_3 would specified, along with the other instances as follows:

("INST_0" 0 (0,0) R0);
("INST_1" 0 (1,0) R0);
("INST_2" 1 (0,0) R0);
("INST_3" 1 (1,0) R0);
("INST_4" 0 (1,1) R0);

Here, INST_3 and INST_1 are identified as being in column 1, both in the first position in the column. As a result, when the datapath placer 130 places the instances for this function, it uses the tile file 311 description to control the placement of the instances, and thereby preserve the structural regularity in the datapath function 309.

Returning again to the description of the tile files 311 then, additional information may also be provided in the tile file 311 to aid the datapath placer. The value bitwidth of the fuctionBitWidth property defines the number of bits that the datapath function 309 associated with the tile file 311 spans. This property is optional, and need not be present if the tile file 311 lists the instances in the datapath function 309, as is normally the case and illustrated above, since the maximum bit number of instances in this list are used for the function bit width.

The irregular property 403 specifies whether the datapath function 309 is considered to be a random logic function. The value of the irregular property 403 is either true or false, with false being the default setting. When a datapath function is specified to be random logic, the datapath placer 130 will still place the datapath function 309 relative to the other datapath functions 309 in the datapath region 303. However, the actual placement of the logic cell instances within the datapath function 309 is deferred to standard cell placer 170. As a result then, the placement of the logic cell instances is constrained to the particular area of the datapath region 303 that is assigned to the datapath function 309.

In other words, deferral placement of the logic cell instances is desirable because it allows the automated capabilities of the standard cell placer 170 to be used, while preserving the relative placement of the datapath functions in the datapath region as created by the datapath placer 130. As a result, the global bus structures in the datapath region 303 are maintained. In the absence of this ability to identify a datapath function 309 as a random function and thereby maintain the logic cell instances of the function relatively close together, the standard cell placer 170 would place these logic cell instances at any location that optimized placement, without regard to the routability of the placement. This would result in loss of the regularity of the databus routing through the datapath.

Figure 6B:
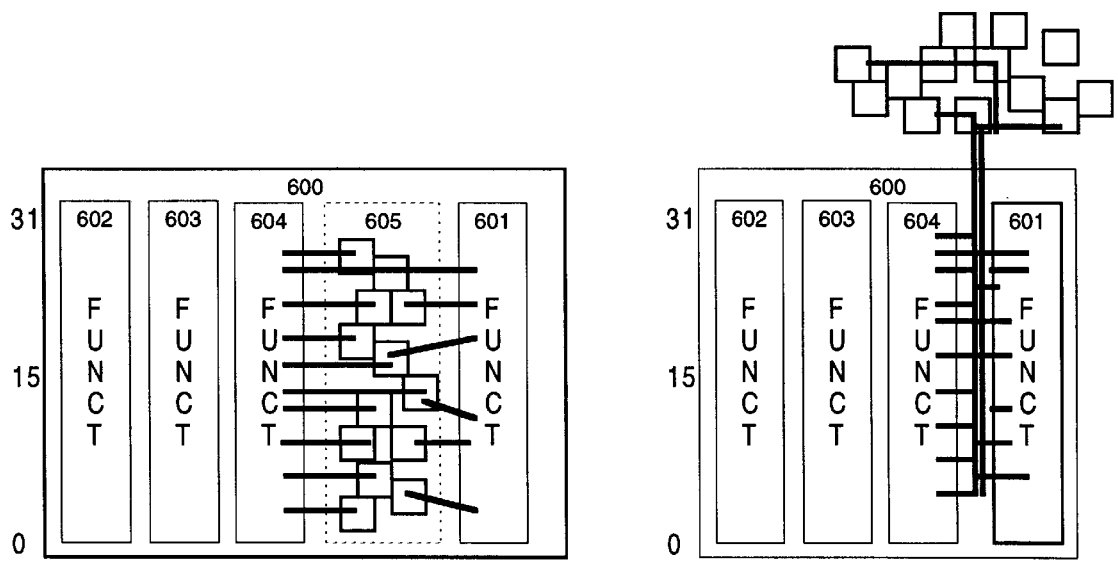
FIG. 6b illustrates a datapath region with a datapath function that is defined as random logic.

FIG. 6b illustrates this feature. Here, a datapath region 600 includes datapath functions 601–605. The tile files 311 for the functions 601–604 set the functionIrregular property to false. As result, the datapath placer 130 has placed the functions using the relative placement information the instance information. However, datapath function 605 corresponds to a tile file 311 with the functionIrregular property set to true indicating that the function is random logic. Here, the datapath placer 130 does place the datapath function 605, as shown by its dotted outline, but leaves such placement of the logic cell instances therein to the standard cell placer 170. Since the datapath placer 130 has already placed the other functions 601–604, the placement of instances within datapath function 605 is relatively constrained to the area of the function, as shown by the dotted outline of the function.

Figure 6C:
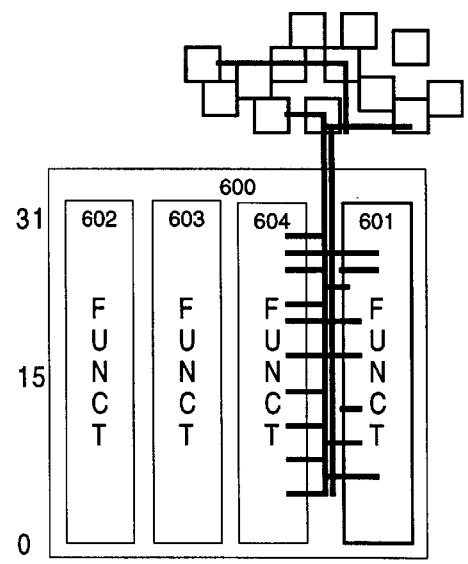
FIG. 6c illustrates a datapath region with random logic in a conventional system.

In contrast, FIG. 6c illustrates how the datapath region 600 would be placed in a conventional system where the user is not able to assign random logic cells to a datapath function. Here, since the random logic cells are not assigned to a datapath function, they are placed without this constraint on their location relative to the datapath region 600. As a result, there will be significant extra wiring necessary to connect the random logic to the datapath region 600, and generally results in poorer performance.

This is a very powerful and beneficial feature, since in some instances such as fast adders the circuit designer typically has a good understanding of the logical grouping of the instances within the datapath function, but the intra-function connectivity is sufficiently random that the circuit designer cannot determine the instance placement within the function. By specifying the irregular nature of the datapath function, the designer can preserve the function's relative placement within, but still defer to the standard cell placer 170 the detailed placement of instances in the function.

In this case, where the datapath function is random, then the instanceInformation is not specified, but the function-BitWidth is specified. If the property value is nil, then the datapath function 309 is a non-random function. A tile file 311 for a sample random function that spans a 24 bit databus would include:

(functionIrregular true);

(functionBitWidth 24);

As stated above, each tile file 311 describes a single unique instance of a datapath function 309. While there is no logical constraint preventing a tile file 311 from including information for more than one datapath function 309, having each tile file 311 correspond to a single function provides for easier implementation and management of the datapath placer 130, and further allows for easier maintenance and substitution of tile files 311.

Each datapath region 301 is associated with one or more tile file list files 313. A tile file list file 313 lists all of the tile files 311 associated with the datapath region. Specifically, the tile file list file 313 associates each datapath function 309 with a tile file 311 that will be used to instantiate the datapath function 309. One implementation of the tile file list file 313 is:

```
Tile File List File {
    (<Tile File name> <path to instance of datapath
        function>)
    ...
}
```

When the design hierarchy is such that each datapath function 309 has an independent hierarchy, then the path to the datapath function 309 includes the design hierarchy path to the instance of the datapath function 309. However, when the design hierarchy is such that the each datapath function 309 does not have an independent hierarchy, then a unique function name is included for each function in the tile list file 313.

Figure 2B:
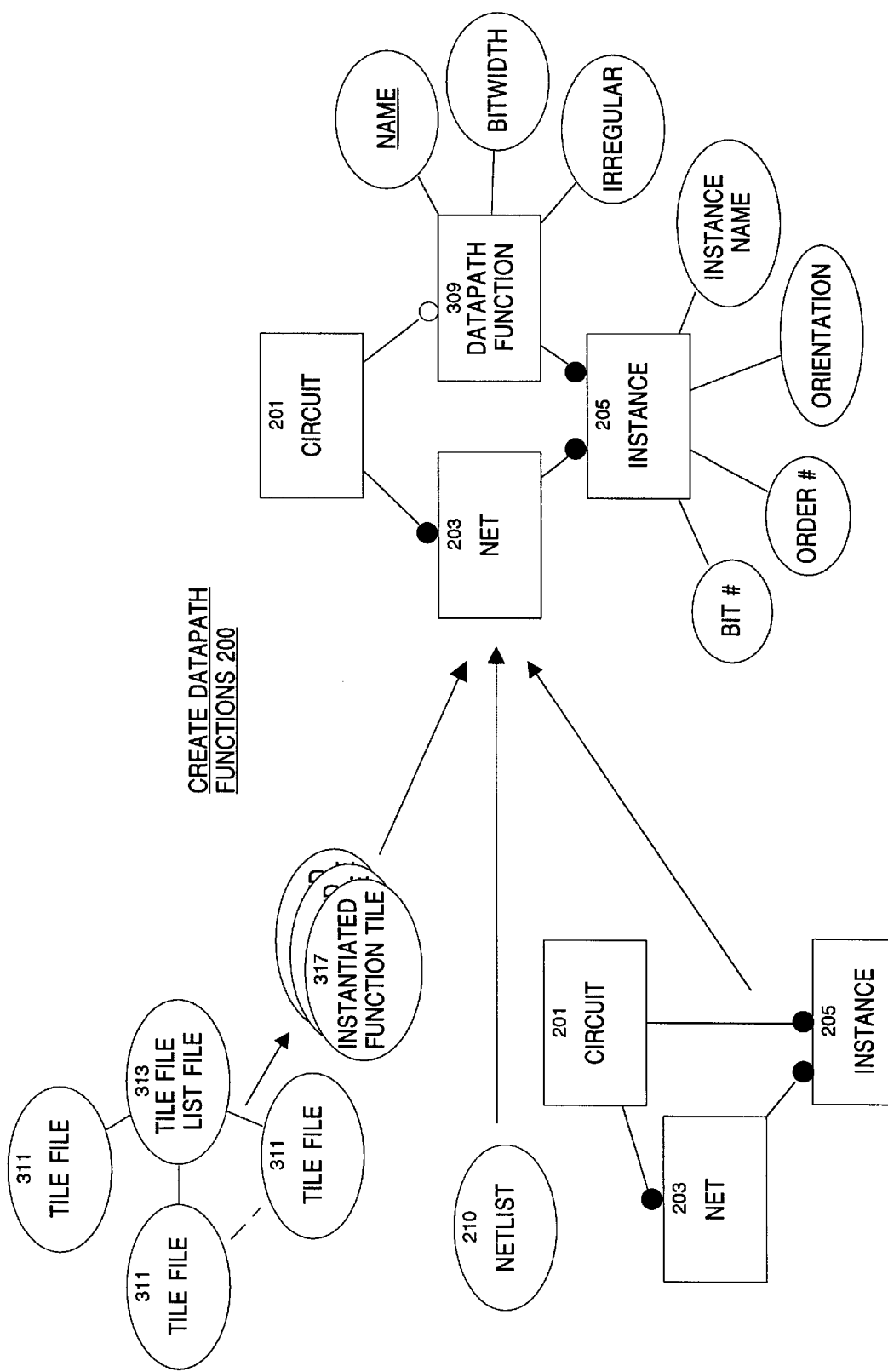
FIG. 2b is an illustration of the dataflow for creating datapath functions in the layout database using tile files and tile file list files.

Referring again then to FIG. 2, the process of creating 200 datapath functions 309 takes as inputs a set of tile files 311, a tile file list file 313, and the netlist 210. Referring to FIG. 2b, the information stored for the circuit 201 is then modified with the correct identification and association of instances 201 with their datapath functions 309, and further, each instance 203 in a datapath function 309 is modified to include the relative placement information, described above.

More particularly, in one embodiment, this transformation of the circuit 201 may be described in part by the following steps:

1. Read tile file list file 313.
2. For every entry (<tile file name><path to instance of datapath function>) in the tile file list file 313:
3. Open tile file 311 <tile file name> in entry.
4. For each logic cell instance, <instanceName>, listed in instanceTileInfo in the tile file 311:
5. Append <path to instance of datapath function> from tile file list file 313 entry to path to <instanceName>.

Step 4 creates a list of unique instance pathnames with relative placement information. Since the path to the instance specifies a particular instance within a particular function, coupling the the path to the instance of the datapath function with the path to the instance name associates unique instances in the netlist with particular datapath functions 309, and provides the instance with the relative placement information in the tile file 311. The result is called an instantiated function tile 317, meaning that the tile file 311, which is generic, has now been instantiated for a particular one of the datapath functions 309. When step 2 is completed, there is then a set of instantiated function tiles 317 for the entire circuit. Note that some instantiated function tiles will be random logic where the underlying tile file 311 is identified as a random logic function (functionIrregular is true).

An example of the foregoing is as follows:

Assume that there are two unique datapath functions 309, FA and FB, with associated tile files 311, FA_Tile, and FB_Tile, for an integrated circuit called chip, and there are three instances of these datapath functions, foo, bar, and xyz as shown in the following tile file list file 313:

```
Tile File List File {
    (<FA_Tile> <chip/foo>)
    (<FA_Tile> <chip/bar>)
    (<FB_Tile> <chip/xyz>)
}
```

Tile files for FA and FB each specify instance information for instances IO through In.

The instantiated function tile 317 for datapath function foo is:

```
INST_FOO {
    (<chip/foo/IO instanceInfo>)
    (<chip/foo/I1 instanceInfo>)
    ...
    (<chip/foo/In instanceInfo>)
}
```

The instantiated function tile 317 for datapath function bar is:

```
INST_BAR {
    (<chip/bar/IO instanceInfo>)
    (<chip/bar/I1 instanceInfo>)
    ...
    (<chip/bar/In instanceInfo>)
}
```

The instantiated function tile 317 for datapath function xyz is:

```
INST_XYZ {
    (<chip/xyz/IO instanceInfo>)
    (<chip/xyz/I1 instanceInfo>)
    ...
    (<chip/xyz/In instanceInfo>)
}
```

At this point, the transformation of the circuit 201 in the layout database 195 is not yet complete. The process is completed by the following steps:

6. Read the netlist.
7. For each instantiated function tile:
8. Create a datapath function 309 grouping in the layout database to link instances in the function.
9. For every entry in the instantiated function tile:
10. Find corresponding instance in the netlist from the instance pathname in the entry. There is only one instance in the netlist for the instance in the instantiated function tile.
11. Associate instance in database with the datapath function 309.
12. For each instance in the datapath function 309:
13. Attach properties from instance information to instance: Bit #, Order # (including column and order where necessary), and Orientation.

Steps 10 and 11 create a one-to-many association in the layout database 195 for the datapath function 309 to the instances within the datapath function. The number of such datapath functions 309 is the number of instantiated function tiles, and this is the number of entries in the tile file list file 313. Steps 12 and 13 then complete the modification of the layout database 195 for each datapath function 309 by updating the instances in the datapath function 309 with the instance information from the instantiated function tile. The result of this process is a set of instantiated datapath functions 309.

Figure 2C:
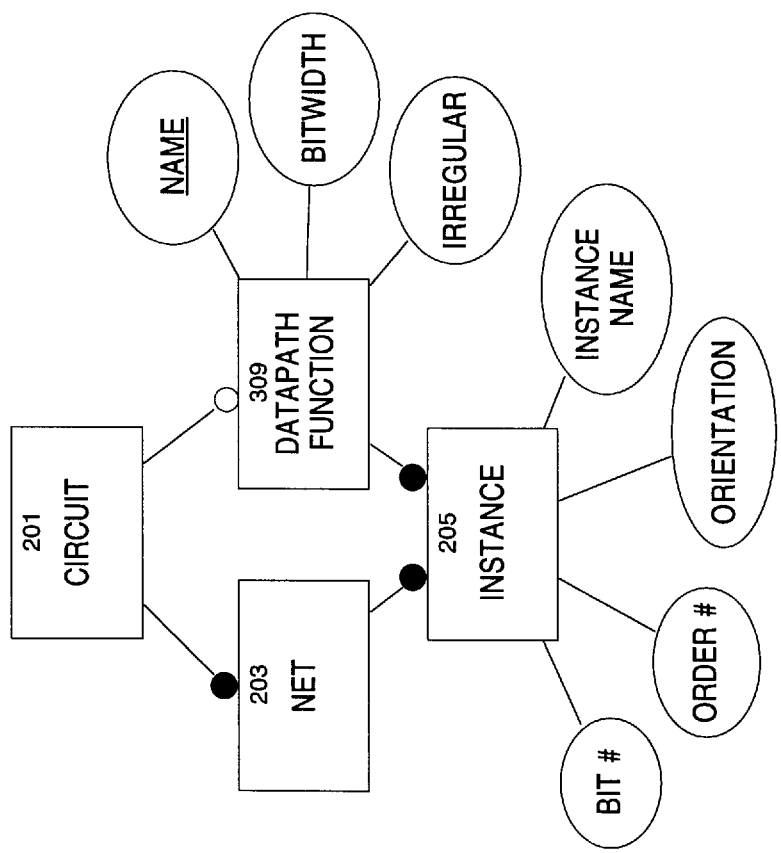
FIG. 2c is an illustration of the circuit definition in the layout database following the creation of datapath functions.

The resulting information for the circuit 201 in the layout database 195 is shown on the right side of FIG. 2b, and in FIG. 2c.

Figure 7:
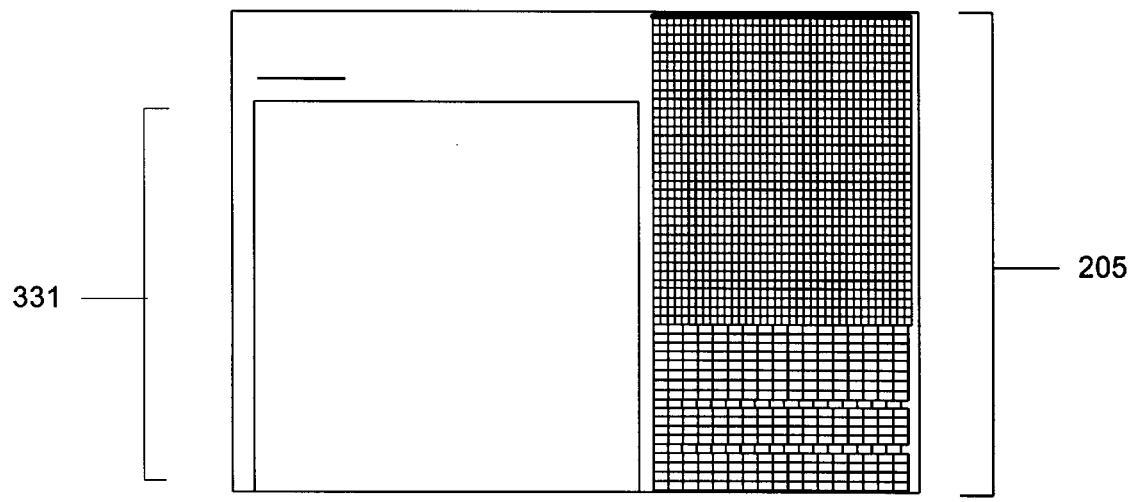
FIG. 7 is an illustration of the user interface of the datapath placer prior to creating datapath functions.

FIG. 7 illustrates an embodiment of the user interface of the datapath floorplanner 120 prior to the creation 200 of datapath functions 309, as displayed on a display device of the computer 110. The empty square 331 is the boundary of the integrated circuit 201. Along the right side of the display are arranged the instances 205 within the circuit 201. At this point, none of these instances is associated with a datapath function 309. Thus, floorplanning of datapath functions 309 and datapath regions 303 cannot be done yet.

Figure 8:
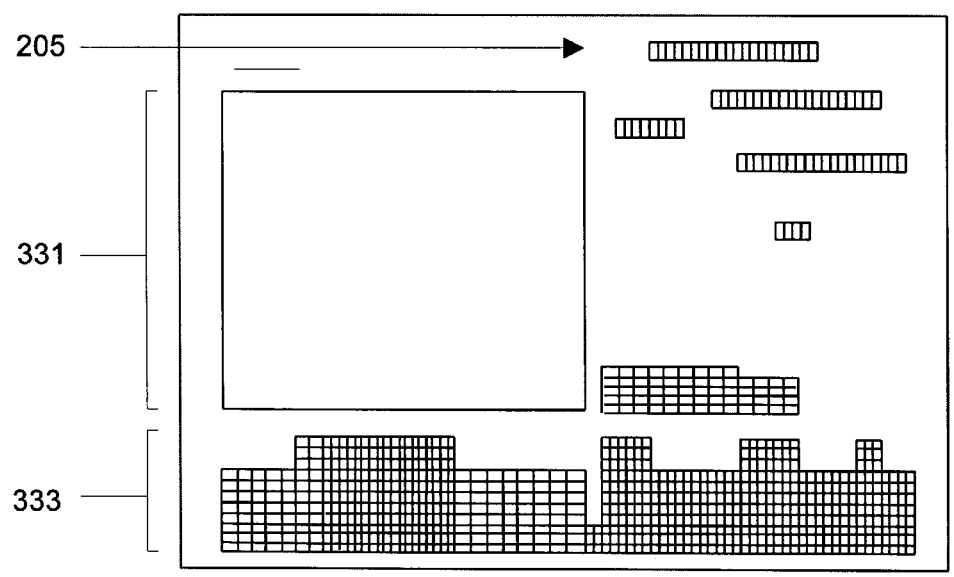
FIG. 8 is an illustration of the user interface of the datapath floorplanner after creating datapath functions.

FIG. 8 illustrates the user interface following creation 200 of datapath functions 309. Here, all instances that were part of a datapath function 309 have been aligned in vertical columns 333, each vertical column representing a datapath function 309. Instances 205 that where not associated with any datapath function 309, such as random logic for control purposes, are placed in the upper right portion of the display. Now the circuit designer is able to place datapath functions 309 and create 202 datapath regions 303.

Creating Datapath Regions

Figure 2D:
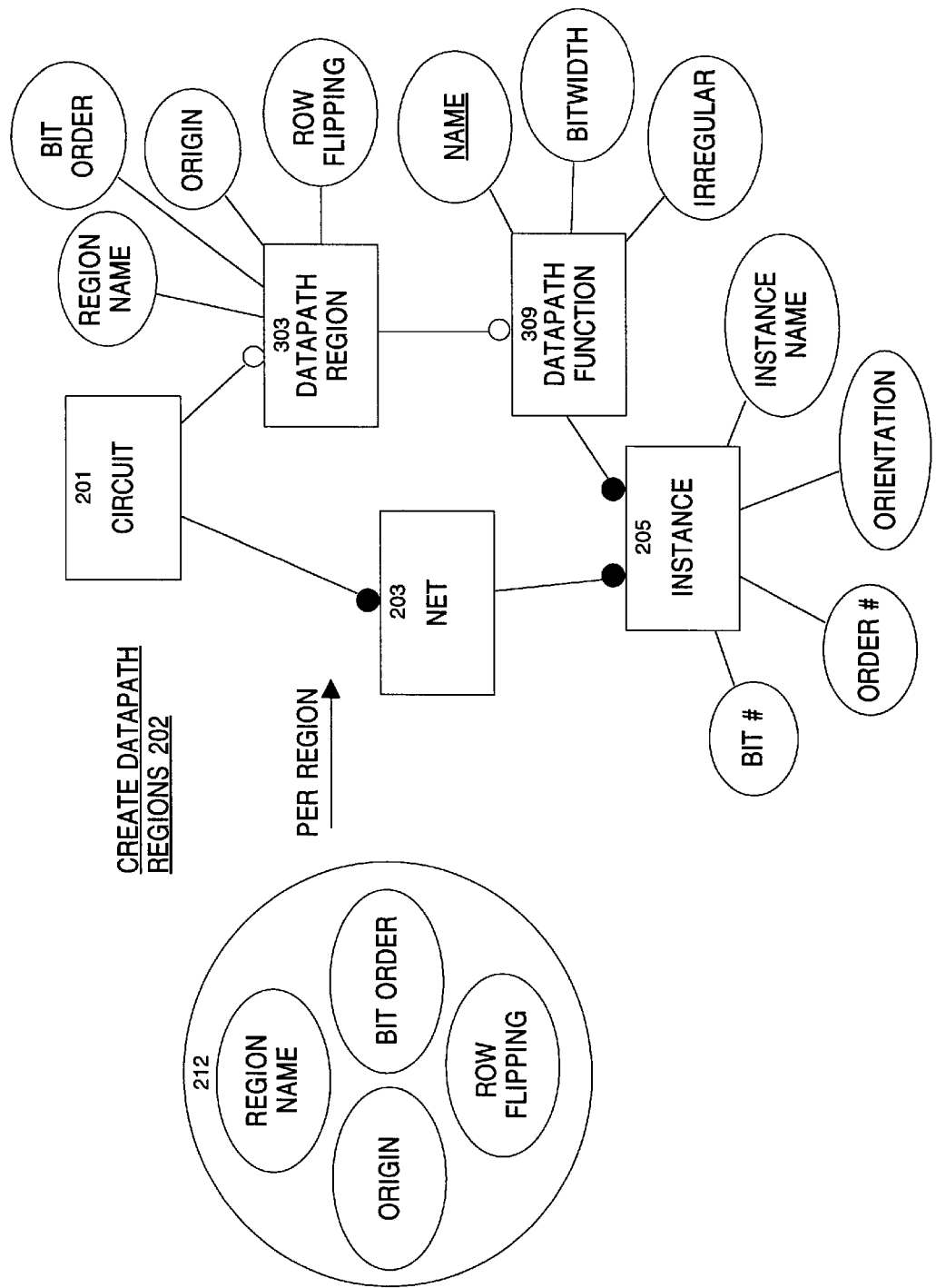
FIG. 2d is an illustration of the dataflow for creating datapath regions in the layout database.
Figure 9A:
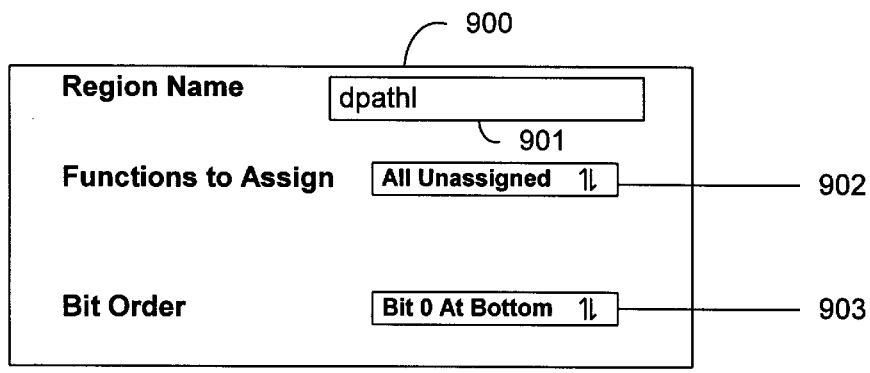
FIGS. 9a through 9c are illustrations of the user interface of the datapath floorplanner for receiving datapath region information.

Referring again to FIG. 2, the next floorplanning operation is the creation 202 of datapath regions 303. FIG. 2d illustrates the relevant dataflow of this process. For each desired datapath region 303, user specified data 212 for each datapath region 303 is input. The user inputs a name for the datapath region 303, and then assigns one or more datapath functions 309 to the region. The assignment of datapath functions 309 may be automatic (assigning all previously unassigned datapath functions 309 to the current datapath region 303) or manual. If manual, the assignment may be done visually, by dragging datapath functions 309 to a displayed datapath region 303 on the display. Alternatively, the assignment may be done by selecting datapath functions 309 from a menu list or the like. FIG. 9a illustrates dialog box 900 for the datapath floorplanner 120 wherein the user specifies the region name 901, and automatic selection of unassigned functions 902.

Figure 2E:
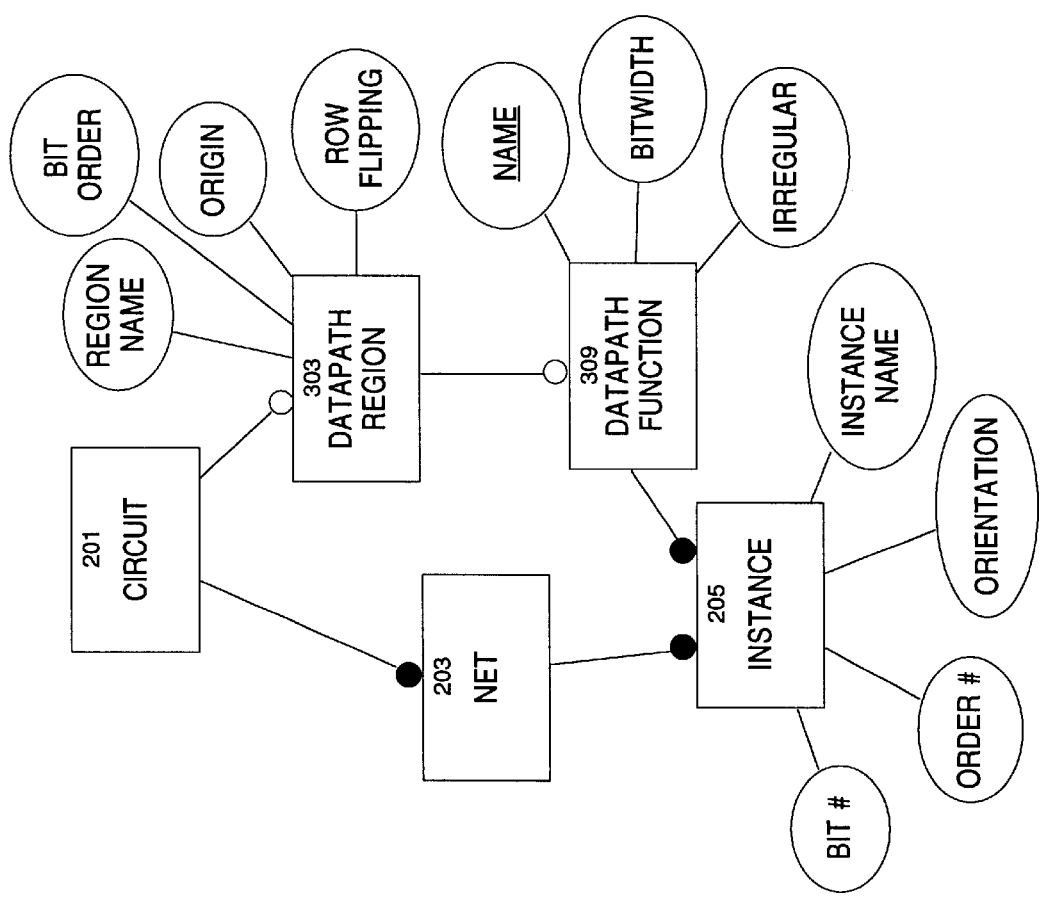
FIG. 2e is an illustration of the circuit definition in the layout database following the creation of datapath regions.
Figure 9B:
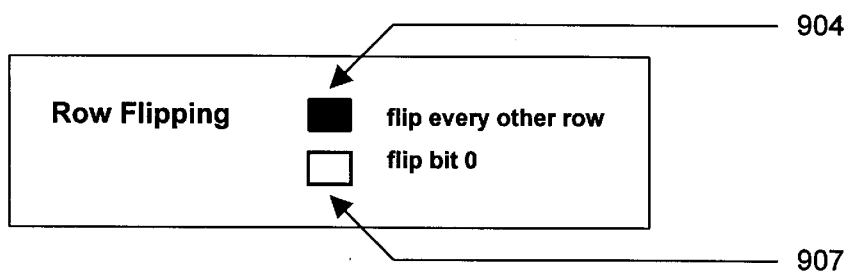
Figure 9C:
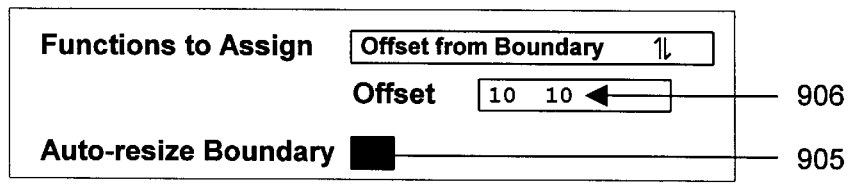

The circuit designer also specifies structural details of the datapath region 303. These include whether the $0^{th}$ bit is set at the bottom of the region or the top (903, FIG. 9a) whether flipping of rows is used to permit sharing of power and ground (904, FIG. 9b), and whether independently is bit 0 flipped (907, FIG. 9b). The circuit designer further specifies the region origin 906 and whether the datapath floorplanner 120 should automatically resize the boundary of the containing circuit (905, FIG. 9c). FIG. 2e illustrates the resulting circuit definition in the layout database 195.

Figure 9D:
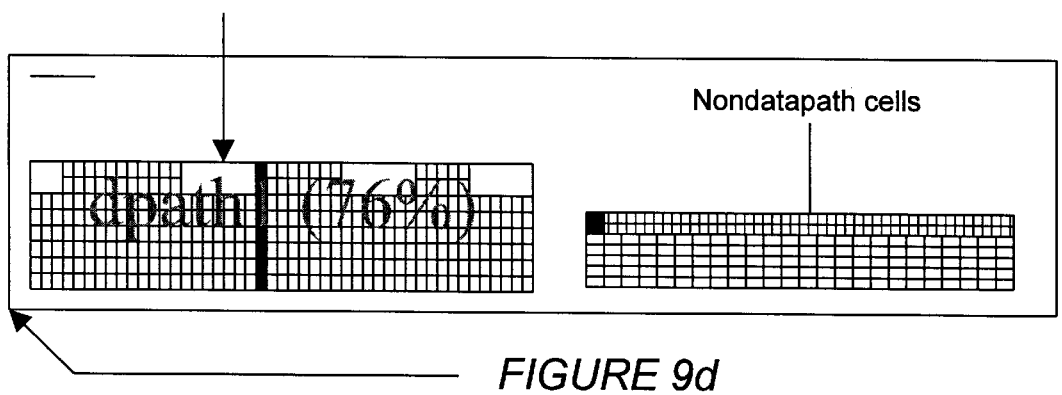
FIG. 9d is an illustration of the user interface of the datapath floorplanner displaying a created datapath region.

From the specified information, the datapath floorplanner 120 can initially size the datapath region 303 to encompass the assigned functions. FIG. 9d illustrates the resized block boundary with all of the unassigned datapath functions 309 placed in the datapath region "dpath1".

It should also be noted with respect to FIG. 9d, (and the flow diagram of FIG. 2, that the non-datapath cells shown on the right side of the figure as those that will be placed incrementally by the standard cell placer 170 in the empty areas (shown as white space) of the datapath region dpath1. In other words, the present invention allows for the integration, or mixing, or placement of datapath functions by the datapath placer 130 along with the placement of random logic by the standard cell placer 170 in a single, integrated design methodology. This approach results in highly optimized routing and placement of datapath functions since their regularity is preserved by the datapath placer 130, and wasted space is reduced since the standard cell placer 170 can "fill in" the remaining, unplaced areas of the datapath region. In contrast, in conventional systems where datapaths are custom placed, the remaining, unplaced areas in the datapath region are not available to the standard cell placer 170 for placing random logic.

Create & Modify Datapath Constraints

Referring again to FIG. 2, once some number of datapath regions 303 have been defined, the circuit designer specifies 204 for each such datapath region 303 a number of datapath constraints. These constraints control the operation of the datapath placer 130 and the routing space estimator 140 on each particular datapath region 303.

The datapath constraints may be categorized into three groups:

Net Exit Constraints

Net exit constraints 214 are constraints on the relative placement of datapath functions 309 in the region. For each datapath region 303 there will be some number of nets that exit the region and couple datapath functions 309 therein to datapath functions 309 or control logic external to the region.

Figure 10:
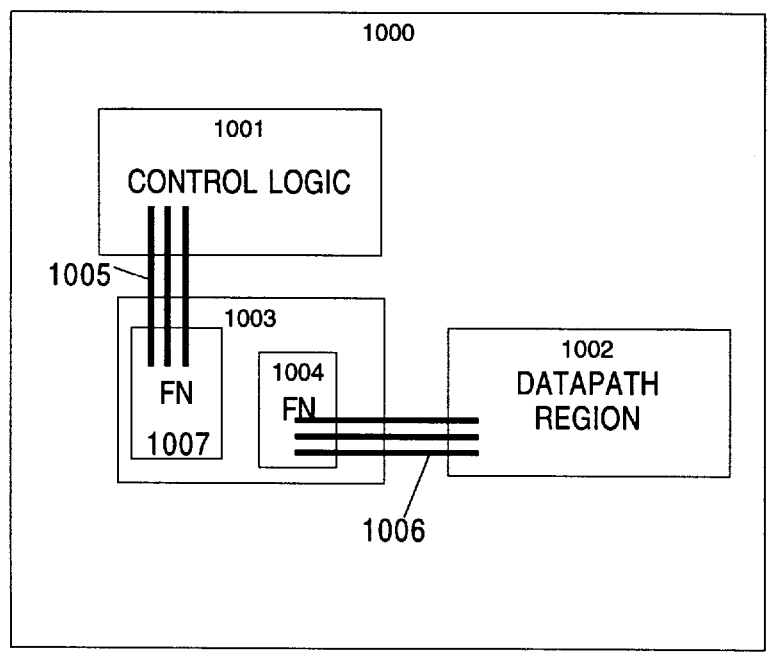
FIG. 10 is an illustration of a circuit showing net exit constraints.

FIG. 10 provides an illustrative example. Here, in circuit 1000, there are two datapath regions 1002, and 1003, and a control logic section 1001. Datapath region 1003 includes two datapath functions 1004 and 1007. Datapath function 1007 has a control net 1005 that should exit from the top into control logic 1001; datapath function 1004 and a datapath net 1006 that should exit to the right into datapath function 1002. The timing between control logic 1001 and function 1007 may be very critical, and so to ensure that the nets 1005 properly exit at the top and have the shortest path to the control logic 1001, the circuit designer can establish this as a constraint on datapath region 1003. When the datapath placer 130 places the datapath regions relative to one another and the control logic, it will abide by this constraint so that the datapath region 1003 remains below control logic 1001 and to the left of datapath region 1002. In contrast, conventional systems do not provide the circuit designer the ability to specify net exits constraints to constraint the relative placement of the datapath regions with respect to each other.

The process of specifying net exit constraints, for a current datapath region 303 may be described as follows:

1. Determine nets that exit the datapath region 303.
2. For each logic cell instance in the netlist or layout database 195.
3. Traverse nets that couple the instance to one or more, terminating instance.
4. Determine for each terminating instance whether its parent datapath region 303 is the current datapath region 303, and if not, mark the net as an exiting net.
5. For each exiting net, assign a default exit value. The default values are one of (Top, Bottom, Left, Right). They are heuristically assigned, and accordingly, may be overridden by the circuit designer.
6. Identify control net as nets that connect multiple instances within a function.
7. Assign default as Top or Bottom, depending on position of current datapath region relative to other datapath regions.
8. Identify datapath nets, as nets that connect instances in multiple functions. If pin instance data is available for net, use the location of pin to determine net exit, otherwise, assign default as Right or Left depending on position of current datapath region relative to other datapath regions.

The resulting nets are displayed to the circuit designer on the display device. The circuit designer may choose to modify any or all of the default net exit assignments.

Figure 2F:
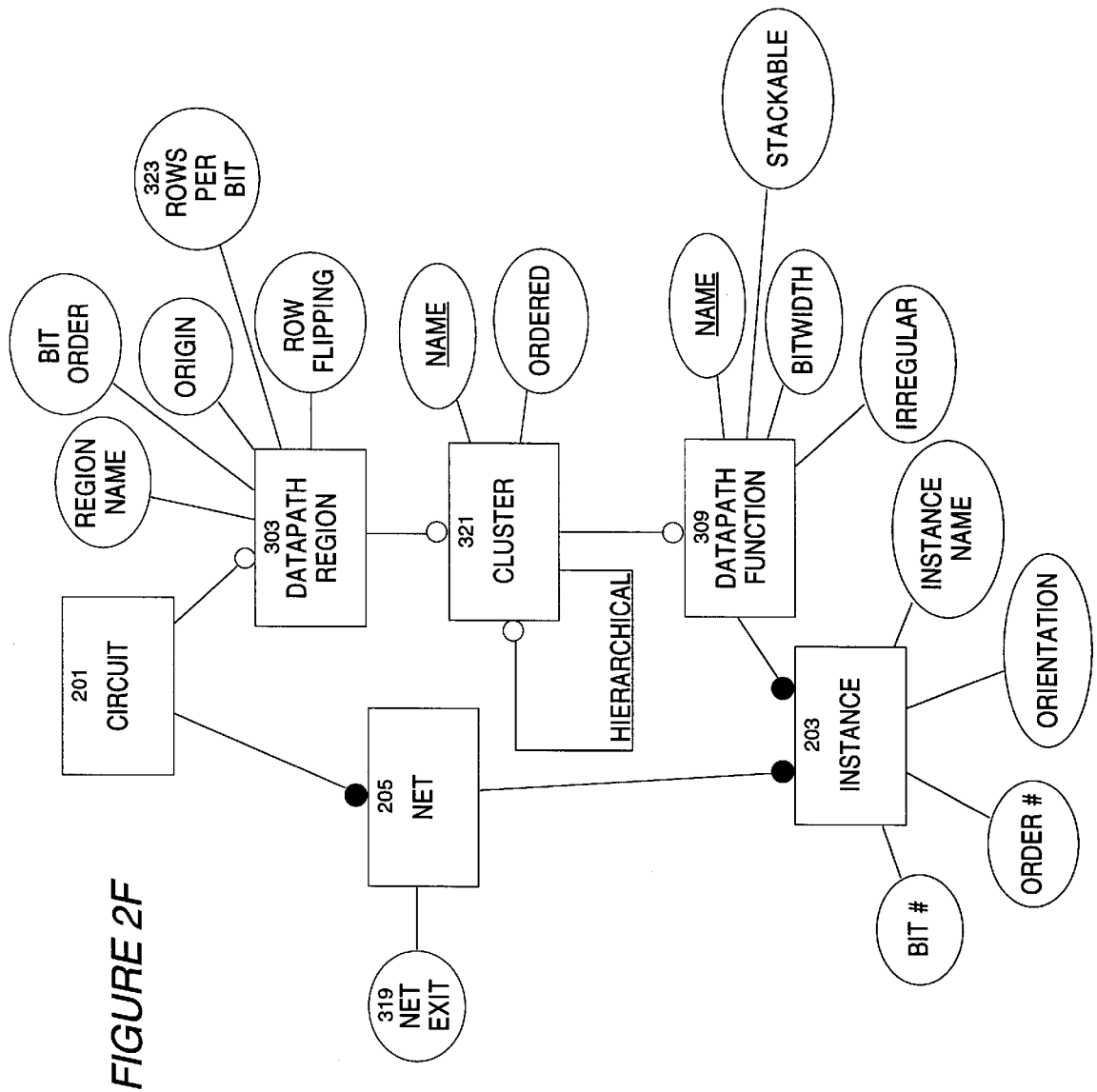
FIG. 2f is an illustration of the circuit definition in the layout database after being updated to reflect the use of net exit constraints and clusters.

FIG. 2f shows the net exits in the schema for the circuit. Selected nets 205 will have a specified net exit constraint 319.

Create Clusters

Figure 11:
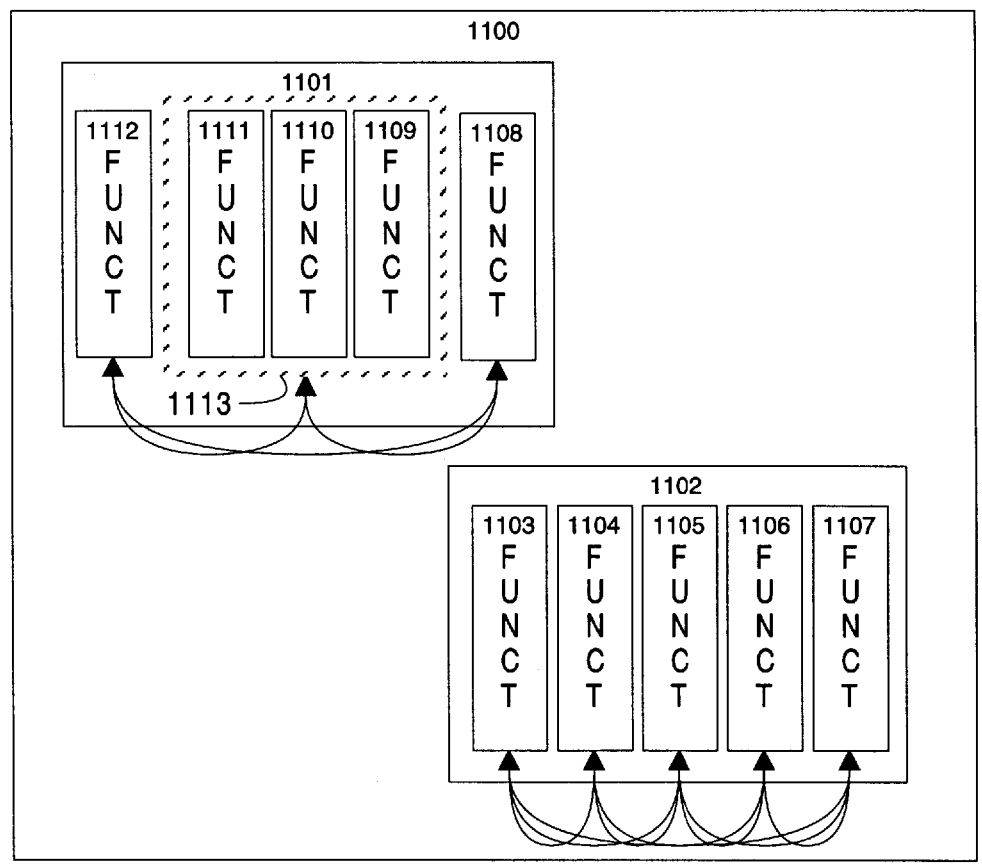
FIG. 11 is an illustration of a circuit having clusters of datapath functions in a datapath region.

Cluster constraints 216 are another type constraint that the circuit designer may impose on the datapath placer 130. A cluster is grouping of datapath functions 309 within a datapath region 303. The datapath placer 130 treats the cluster as a single entity, places it as a block relative to the other datapath functions 309 in the datapath region 303. FIG. 11 illustrates the concept of clusters.

Here, the integrated circuit 1100 includes two datapath regions 1101 and 1102, with datapath functions 1108–1112 and 1103–1107 respectively. In datapath region 1102, there is no clustering of datapath functions. Accordingly, the datapath placer 130 is free to swap the relative positions of any of datapath functions 1103–1107, as shown by the multiplicity of connecting arrows.

However, in datapath region 1101, datapath functions 1109, 1110, and 1111 have been grouped into cluster 1113. Here, the datapath placer 130 must treat this cluster 1113 as a unit, and can move this unit relative to datapath functions 1108 and 1112 only. The ability to cluster datapath functions and thereby control the relative ordering of datapath functions within the region is useful for controlling timing between selected datapath functions. For example, there may be critical timing requirements between datapath functions 1109–1111 that the circuit designer needs to control. Without clusters, as in conventional systems, there is simply no way for the circuit designer to control the grouping of datapath functions in this manner, and thereby optimize performance as desired and enabled by the present invention.

Accordingly, for each datapath region 303, the circuit designer can create one or more clusters. Each such cluster has two attributes, in addition to a list of datapath functions 309 associated with the cluster. First, a name is assigned to the cluster by the user. Second, the user specifies whether the cluster is ordered or unordered. In an ordered cluster, the order of the datapath functions is specified by the circuit designer. In the example of FIG. 11, if cluster 1113 was ordered, then the datapath placer 130 must place the datapath functions 1109–1111 in the order shown. If the cluster is unordered, then the datapath placer 130 is free to swap the positions of the datapath functions within the cluster. Thus, in FIG. 11, if the cluster 1113 were unordered, the positions of datapath functions 1109–1111 could be exchanged in any order.

Figure 12:
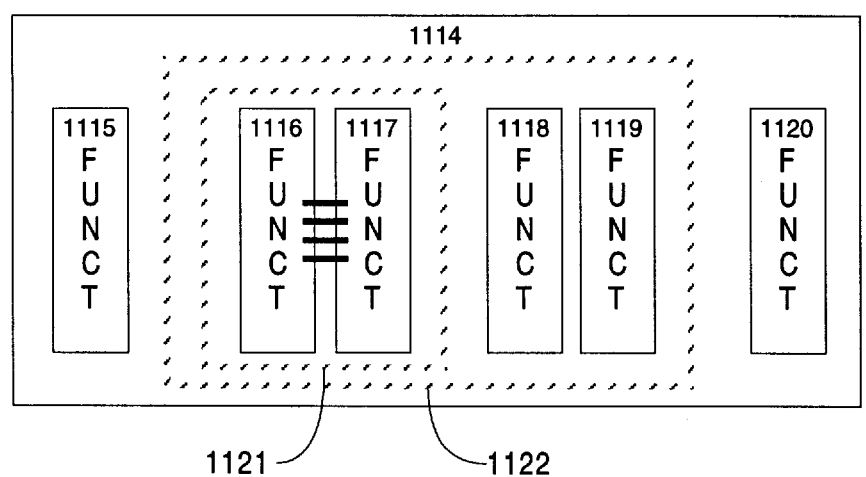
FIG. 12 is an illustration of a circuit having hierarchical clusters.

Finally, clusters may be hierarchical, so that a cluster may include other clusters in addition to datapath functions 309. FIG. 12 illustrates a datapath region 1114 with a hierarchical cluster 1122 including a cluster 1121 and two datapath functions 1118, 1119. Cluster 1121 is ordered to preserve the nets connecting the function therein. Datapath functions 1115 and 1120 are included in the datapath region 1114, but not clustered.

Clustering function is also useful to take advantage of one of the features of the datapath placer 130, which is function stacking. Datapath functions are not all necessarily of the same bit width, and thereby vertical height. Rather, within a single datapath region, some datapath functions may be 32 bits wide, and others, fewer bits.

Figure 13A:
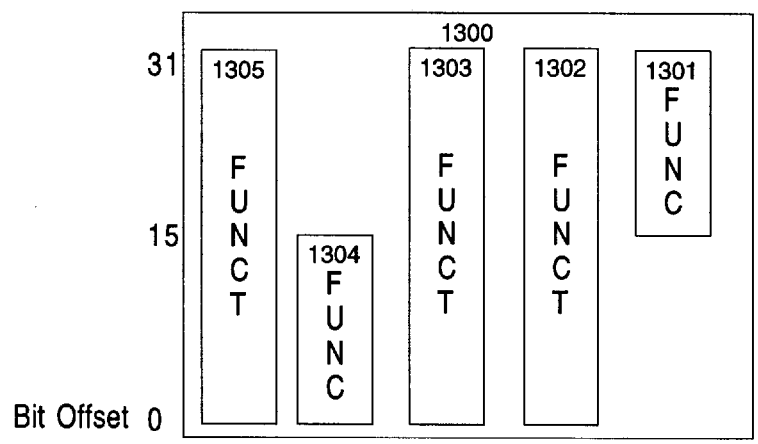
FIG. 13a illustrates a datapath region without stacking of datapath functions.
Figure 13B:
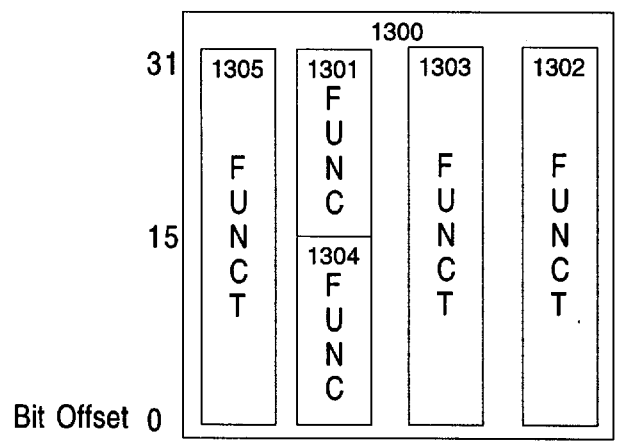
FIG. 13b illustrates the same datapath region with stacking of datapath functions.

FIG. 13a illustrates a datapath region with such an organization. Here, datapath region 1300 includes three 32 bit datapath functions 1302, 1303, and 1305. Datapath function 1301 is a high order function, being 16 bits wide and offset to the 16 bit of the region. Datapath function 1304 is a lower order function, being 16 bits wide but is offset to the 0th bit. Accordingly, in this arrangement, the space above datapath function 1304, and below datapath function 1301 is wasted. It is preferable to stack these functions as shown in FIG. 13b. Accordingly, these functions could be specified as part of a cluster, so that the datapath placer 130 places them together upon placement. For this usage then, each datapath function in a cluster is specified whether the datapath function is stackable or not. By default, all datapath functions are stackable.

FIG. 2f illustrates the layout database 195 as updated to reflect the use of net exit constraints 319 and clusters 321.

Interleaving Functions

The final category of datapath constraints are function interleaving constraints 218. Interleaving datapath functions allows the circuit designer to achieve three goals. First, function interleaving allows the circuit designer to adjust the aspect ratio of the datapath region to fit the region into different size area on the integrated circuit. Second, function interleaving allows the circuit designer to reduce the horizontal congestion from routing databuses. Third, function interleaving increases the number of over cell routing tracks available for over the cell routing.

Function interleaving is provided by specifying for each datapath region the number of rows per bit to be used by the datapath placer 130 and routing space estimator 140. The routing space estimator 140 knows how many tracks are available for over the cell routing, with each row having a fixed number of tracks. By increasing the number of rows per bit, , the circuit designer can increase the number of tracks available for routing. The routing space estimator 140 will then provide an estimate of the space required to route the design as a function of the linear ordering determined by the datapath placer 130, whether interleaving is on, and number of rows per bit.

Figures 14A, 14B:
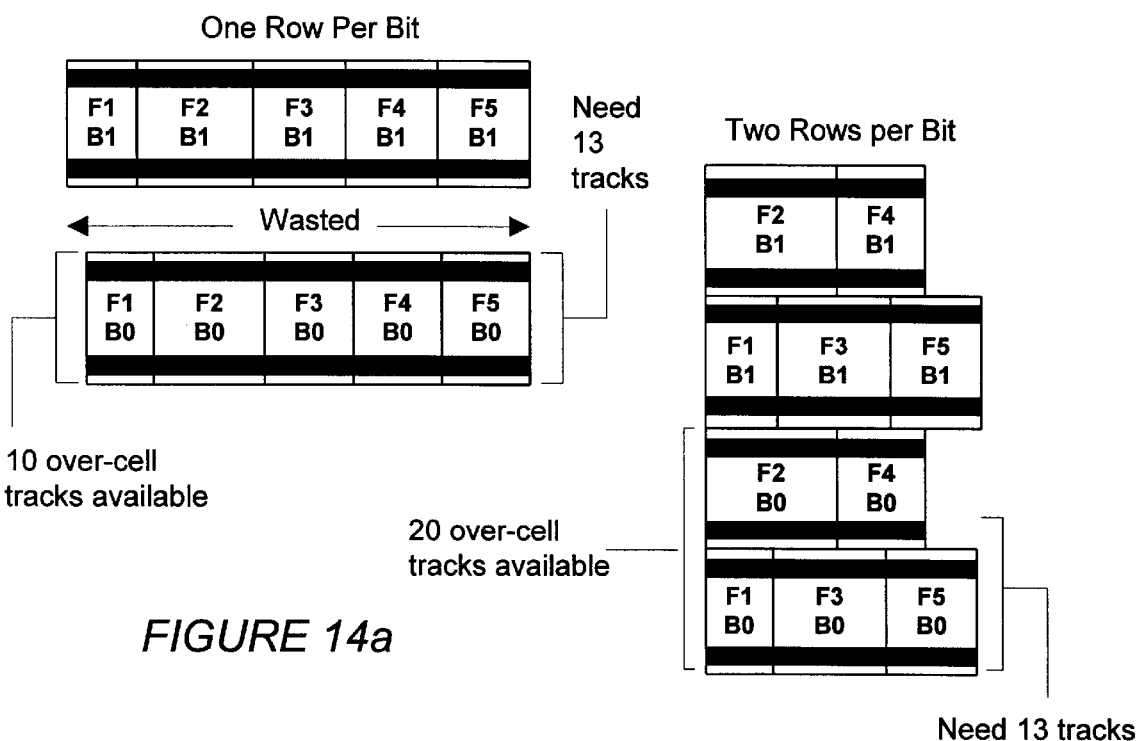
FIG. 14a illustrates a datapath function without function interleaving.
FIG. 14b illustrates the same datapath function with function interleaving.

FIG. 14*a* illustrates a number of instances in a datapath function 1400, where only one row per bit is specified for routing. Each instance is identified by its function (F1–F5) and bit (B0 or B1). As a result, there is wasted space between the rows. Because there is fixed number of routing tracks per row, there is a limited number of overall tracks for over cell routing. In this example, 13 tracks are need per row, but only 10 tracks are available. FIG. 14*b* illustrates the same portion of the datapath function 1400, after two rows per bit have been specified for routing. Now, there are 20 tracks available for overcell routing.

Figure 15A:
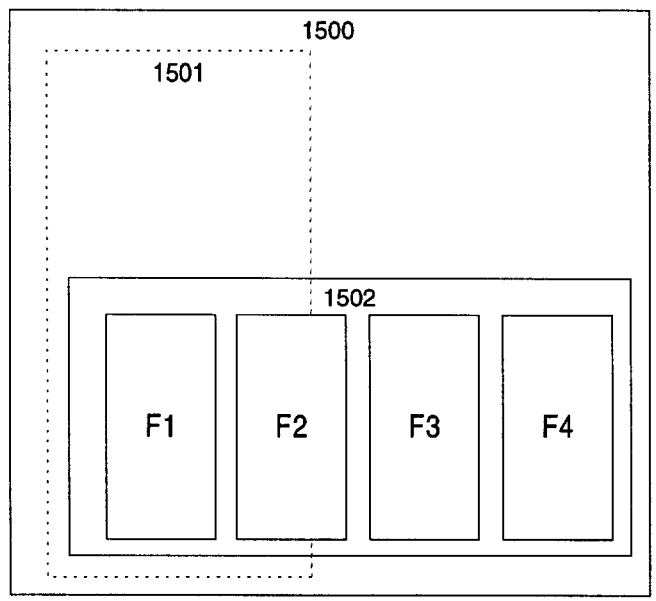
FIG. 15a illustrates a circuit with a datapath region prior to adjustment of the aspect ratio by function interleaving.

FIG. 15*a* illustrates the general utility of changing the aspect ratio of a datapath region to alter its size. In FIG. 15*a*, the circuit 1500 has a narrow and tall area 1501 that is available for placing the datapath region 1502. There are four datapath functions F1, F2, F3, and F4. Here, only 1 row per bit is specified.

Figure 15B:
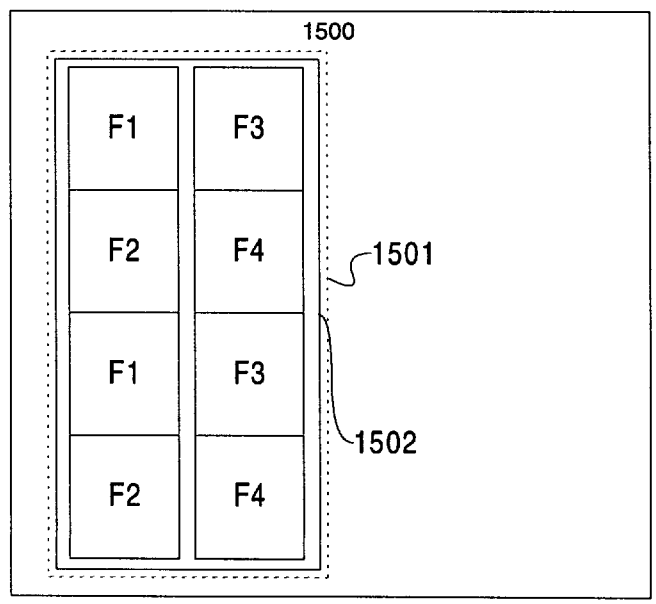
FIG. 15b illustrates the same datapath region after the aspect ratio has been increased by function interleaving.

Specifying 2 rows per bit interleaves the datapath functions as shown in FIG. 15*b*. This increases the aspect ratio so that the region 1502 now fits in the available area 1501.

Function interleaving is not limited to merely stacking datapath functions as illustrated in FIGS. 15*a* and 15*b*. Where different datapath functions have differing column widths, function interleaving will also operate as a bin packing operation to maximize use of horizontal space. Referring again to FIGS. 14*a* and 14*b*, datapath function F2 is wider than the remaining functions F1, F3, F4, and F5. By specifying function interleaving for the datapath region, these individual instances are packed as illustrated in FIG. 14*b*. Note that this bin packing operation is subject to the other constraints on the datapath region, such as net exit constraints, and the relative placement information specified by the tile files, and the linear ordering of the datapath functions as determined by the datapath placer 130. The process by which the datapath placer 130 and routing space estimator 140 perform placement and estimation for function interleaving is further described below.

Again, it should be noted that conventional placement and routing systems do not allow the circuit designer to specify for individual datapath region whether function interleaving is to be used, because such systems do not have the ability to recognize the datapath regions themselves.

FIG. 2*f* illustrates the circuit definition in the layout database 195 for specifying function interleaving using rows per bit 323.

Overall Flow of Datapath Placement & Routing Space Estimation

The datapath placer 130 perform placement 208 of datapath functions 309 within a single datapath region 303, and placement 208 of logic cell instances in each datapath function. In doing so, the datapath placer 130 recognizes each of the datapath functions 309 defined within the datapath region 303, and applies all of the cluster, net exit, and function interleaving constraints of the entire datapath region 303. The datapath placer 130 uses a modified version of the A* algorithm as applied to the placement problem. In one embodiment, the datapath placer 130 may be implemented along the general lines of a datapath layout assembler described in *A Data Path Layout Assembler for High Performance DSP Circuits*, H. Cai, et al., 27th ACM/IEEE Design Automation Conference, Paper 18.1, p. 308–311 (1990). The datapath placer 130 further includes a tiler 257 that performs the actual placement of logic cell instances within datapath functions 309. The datapath placer 130 operates in conjunction with the routing space estimator 140 which estimates 206 the routing space required to route a given ordering of datapath functions in a datapath region. The floorplanning and datapath placement/routing operations are sufficiently fast to make them interactive with the circuit designer.

Figure 16A:
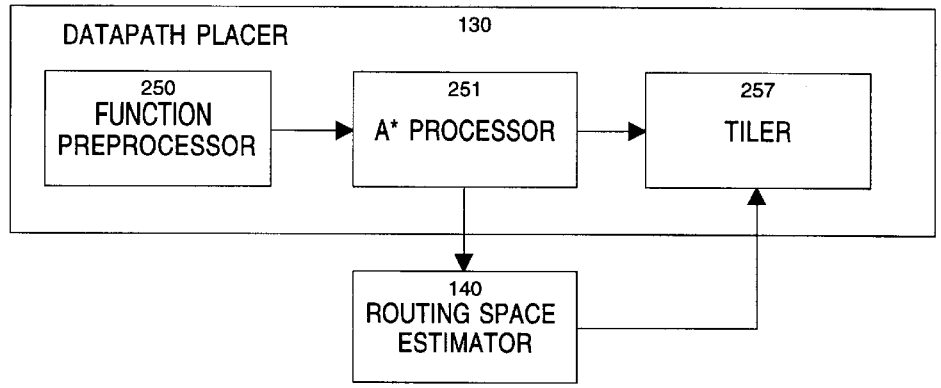
FIG. 16a is a schematic illustration of the datapath placer.

Referring now to FIG. 16*a*, there is shown a schematic illustration of the datapath placer 130 and the routing space estimator 140. The datapath placer 130 includes a function preprocessor 250, an A* processor 251, and a tile 257. The function preprocessor 250 determines for each datapath function 309 a range of suitable bit offsets from the $0^{th}$ bit of the datapath region. The A* processor 251 determines the linear ordering of the datapath functions 309 in the datapath region 301, and the actual bit offset of each function given the range of suitable bit offsets of each datapath function 309. The tiler 257 determines the placement of logic cell instances within the datapath functions 309, using the linear order, and information from the routing space estimator 140. The routing space estimator 140 determines the routing space necessary to route the design.

Figure 16B:
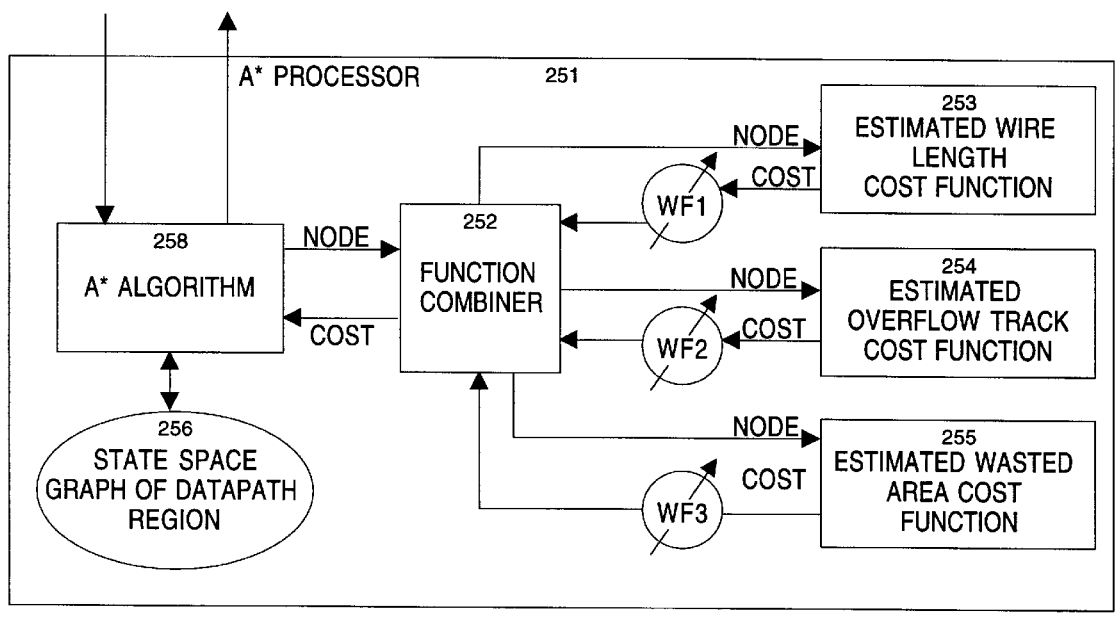
FIG. 16b is a schematic illustration of the A* processor.

Referring to FIG. 16*b*, the A* processor 201 uses a modified A* algorithm 258 to operate on a state space graph 256 of the datapath region 303. The general operation of the A* algorithm 258 is as described in Cai et al., above. Generally, the A* processor 251 iteratively creates a state space graph 256 that defines the placement of each datapath function 309 within the datapath region 303. The state space graph 256 is an acyclic directed graph in which the nodes correspond to subsets of the set of all datapath functions 309 in the region. Associated with each node is a level n that specifies the number of datapath functions in that node. A directed edge $<v_i, v_j>$ couples a node $v_i$ of level n−1 to a node $V_j$ of level n. Associated with each edge is a datapath function 309 that is the incremental datapath function 309 that included in node $V_j$ but not in node $v_i$. The graph has a starting node which represents an initial condition, and an ending node.

Figure 17:
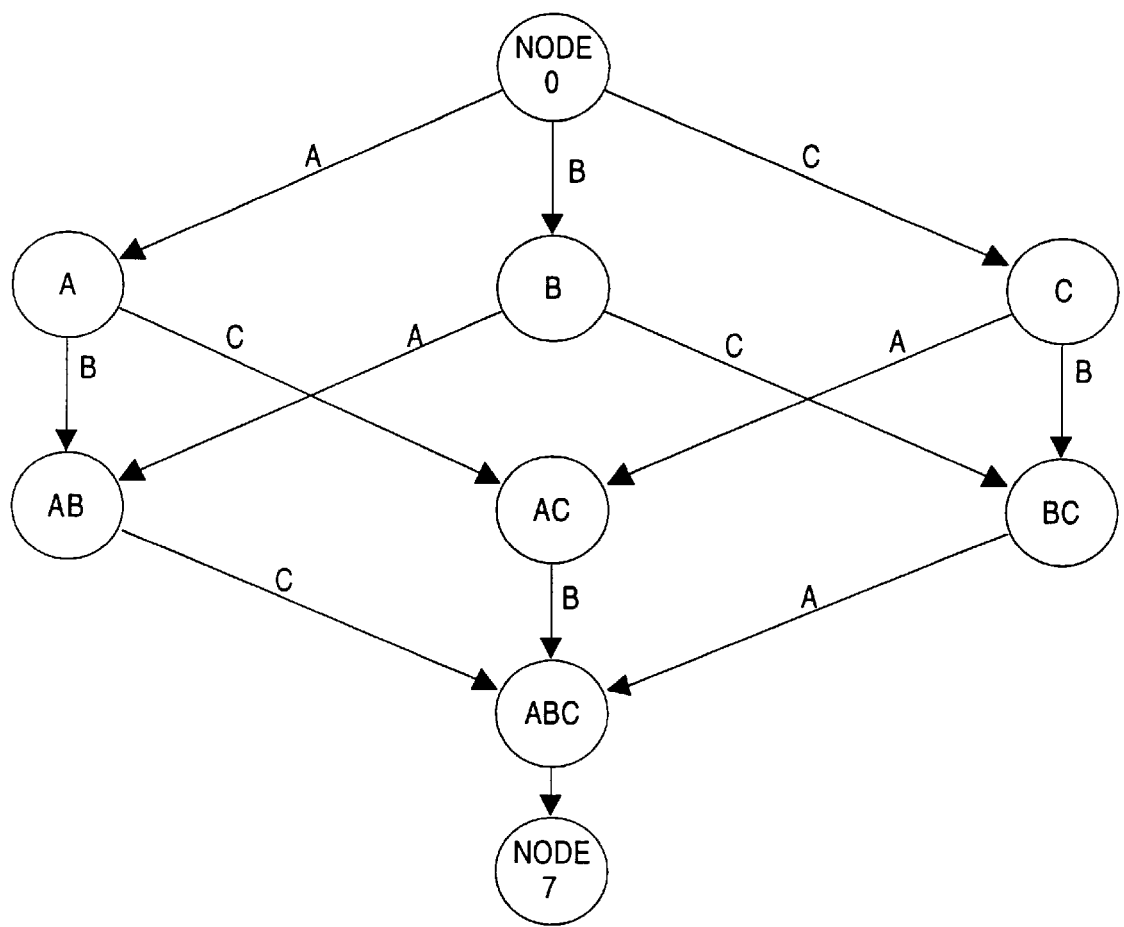
FIG. 17 is an illustration of a state space graph of a datapath region with three datapath functions.

FIG. 17 illustrates a state space graph for a datapath region 303 with three datapath functions A, B, and C. Node 0 is the starting node, and node 7 is the ending node. Each of the remaining nodes is labeled with the subset of datapath functions 309 that it represents. The edges leading from the starting node to a selected node define the ordering of datapath functions 309 within the selected node. For example, there are two paths to node AB, along paths (B,A) and (A,B), each path defining a specific linear order of the set of datapath functions included in node AB.

Generally, an A* algorithm determines a specific ordering of nodes in a state space graph by optimizing a cost function on each of the nodes, and selectively expanding nodes for further evaluation. The cost of each node is determined using three cost functions: an estimated wire length cost function 253, an estimated overflow track cost function 254, and an estimated wasted area cost function 255. Each of these cost functions is weighted with a empirically determined, user selectable weighting factor WF, that allows the user to decide which cost functions to make more or less significant.

The A* algorithm 258 passes nodes of the state space graph 256 to the function combiner 252. The function combiner 252 in turn passes the node to each of the cost functions 253–255 to obtain a cost component therefrom. The weighted cost components are combined by a function combiner 252 into the total cost of the node, and passed back to the modified A* algorithm 258. The modified A* algorithm 258 evaluates the total costs of various nodes and selects for further expansion (processing at the next level) one of the nodes.

Datapath Function Preprocessing

The function preprocessor 250 operates on each datapath function 309 within a datapath region 303. For each datapath function 309, the function preprocessor 250 determines a range of suitable bit offsets from the origin of the datapath region 303, based on a combination of connectivity information, as defined in the netlist, between the given datapath function 309 and other datapath functions 309, and relative bit positions of logic cell instances with the given datapath function 309. The range of bit offsets is used by the datapath placer 130 to determine the vertical placement of the datapath function 309 within the datapath region 303. This allows the datapath functions to be stacked to reduce routing congestion and improve performance.

More particularly, the function preprocessor 250 determines a number of bit offsets for each of the datapath functions 309 that may be used to vertically place the datapath function relative to the $0^{th}$ bit of the datapath region 303. That is, if a datapath region includes datapath functions A, B, C, D, E, and F, and A is coupled by a net only to functions B, D, and F, then the function preprocessor 250 will determine a range of bit offsets for A that allow it to be connected to datapath functions B, D, and F.

For each datapath function F in a datapath region 303, the function preprocessor 250 creates a range R of [bit offset, connectivity weight] pairs, that is R[F]={ [bit offset, connectivity weight]$^n$} Each bit offset is an offset from the $0^{th}$ bit of the datapath region 303. The connectivity weight of a bit offset reflects how many other datapath functions 309 that are connected to the source function would be usefully offset from the source function at that bit offset. The larger the connectivity weight, the better the placement for this source function at that bit offset from a connectivity standpoint.

The A* processor 251, when placing the datapath functions 309, does not always select the bit offset with the largest connectivity weight, but rather, selects a bit offset that overall has the best cost. In other words, sometimes the connectivity weight of the bit offset that is chosen for the datapath function 309 will not be the largest connectivity weight, and thus may be less desireable from connectivity standpoint, but better for reducing wasted space according to the estimated wasted space cost function 255. This tradeoff is made by the A* algorithm 258 itself. Thus, for each bit offset, the connectivity weight reflects the degree of goodness for the bit offset just considering connectivity, but not wasted space, or overflow tracks.

Figure 18:
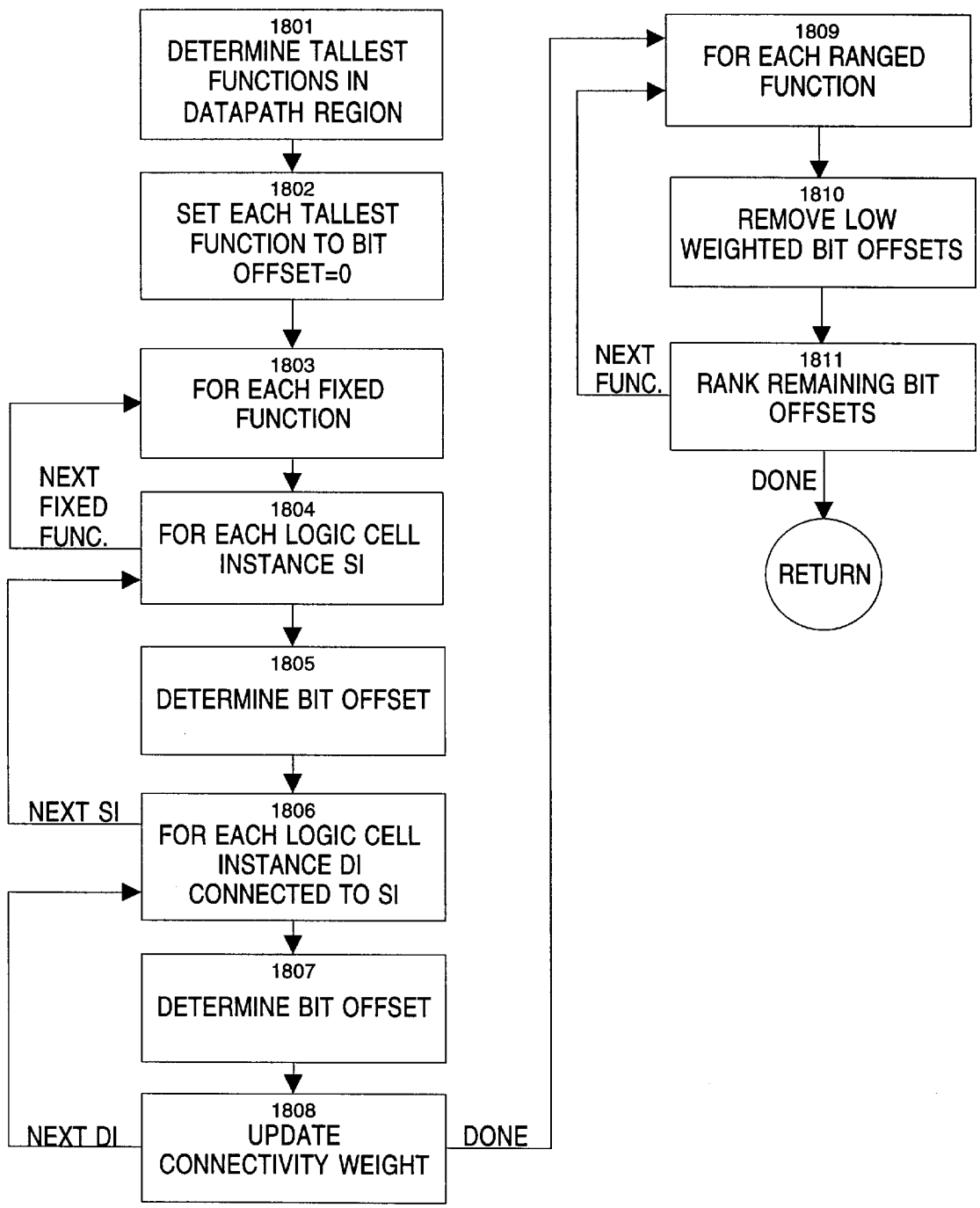
FIG. 18 is a flowgraph of the operation of the function preprocessor in the datapath placer.

Referring to FIG. 18, the function preprocessor 250 operates as follows for each datapath region 303:

The function preprocessor 250 identifies 1801 the tallest datapath function(s) 309 in the datapath region 303, and sets 1802 each to a bit offset of 0. This establishes the baseline of the datapath region 303 so that the tallest functions 309 do not extend outside of the region. Because these datapath functions 309 are tallest, there is only one value for the bit offset, which is 0, and this value is not changed by the datapath placer 130.

Within a datapath region 303, the datapath functions 309 may classified into three groups, depending on whether they have any bit offsets assigned:

Unknown: These are datapath functions 309 for which R, the set of bit offset ranges, is empty, that is R={NULL}.

Ranged: These are datapath functions 309 for which R has more than one [bit offset, connectivity weight] pair. That is R={ [bit offset, connectivity weight]$^2 \cdots {}^n$}. Ranged datapath functions 309 provide a number of alternative bit offsets that are selected from when placing the datapath function 309.

Fixed: These are datapath functions 309 for which R has exactly one [bit offset, connectivity weight] pair. That is R={ [bit offset, connectivity weight] }. This bit offset may be determined by the circuit designer or otherwise previously assigned. The tallest datapath functions which are set to bit offset 0 are also "fixed".

Initially, before preprocessing, the datapath region 303 may have any number of datapath functions 309 in the unknown group, and a certain number in the fixed group. The function preprocessor 250 operates to move all unknown functions into either the fixed group or the ranged group. This is done as follows.

The function preprocessor 250 traverses 1803 over each fixed datapath function.

Within each fixed datapath function 309, the function preprocessor 250 traverses 1804 over each logic cell instance, refered to here as SI, the source instance. The function that includes SI is here refered to as SF, the source function. For each SI, the function preprocessor 250 determines 1805 the bit global offset of instance SI as equal to the bit offset of the datapath function (which is known since the function is fixed), plus the bit number of the of the logic instance, which as shown in FIG. 2a, is determined during the creation 250 of the datapath functions 303 in the datapath floorplanner 120.

Next, the function preprocessor 250 traverses 1806 each logic cell instance in some other datapath function 309 that is connected to the current instance SI. This other instance is refered to here as DI, or destination instance, and the datapath function 309 that includes the instance DI is here refered to as the destination function DF. For each DI in other datapath functions that is connected to the current instance SI, the function preprocessor 250 updates 1807 a [bit offset, connectivity weight] pair for the set R of the destination datapath function. This bit offset is equal to:

Bit Offset of $DF$=(Global bit offset of $SI$)–Bit#($DI$), if$_{13}$ 0, else 0

Global Bit Offset of $SI$=(bit offset of $SF$)+Bit#($SI$)

The global bit offset of SI is the bit offset of the source function SF that includes SI plus the bit# of SI. This bit offset is known because the function is in the fixed group, and the bit# was determined when the datapath function that included SI was created 250 in the datapath floorplanner 120. Similarly, the bit# of DI is also known from that process. Taking the difference between these two value yields the bit offset for the destination function DF that is necessary to couple destination instance DI to source instance SI in the source function SF. That is, it is the relative bit offset between the two functions, the source function SF and the destination function DF.

Figure 19A:
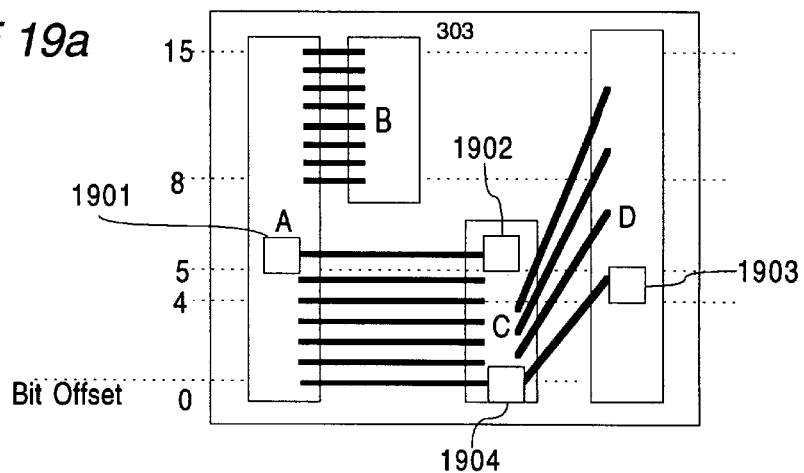
FIG. 19a is an illustration of the determination of bit offsets between datapath functions.

FIG. 19a illustrates the determination of bit offset for a datapath function. Here a datapath region 303 contains four datapath functions A, B, C, and D interconnected by nets as shown. In particular, datapath function A is connected to functions B and C, and function C is further connected to function D. For datapath function C, the set R[C] will have two [bit offset, connectivity weight] pairs, { [0,8], [4,4]}. A first pair [0,8] results from the connectivity of instances in function A with instances in function C. There are eight such instance, with only the first instance 1901 in function A shown. Taking an instance 1901 in function A as the SI (function A is fixed since its height of 16 bits makes it the tallest function in the region), which has a bit# of 5, and the instance 1902 in function C as DI, and applying the above equations:

(Global bit offset of *SI*)–Bit#(*DI*), at least >0

(0+5)–(5)=0.

Since for all of the instance connected between functions A and C the result of this equation is the same, the function preprocessor 250 would increment this bit offset of 0 eight times.

The second pair, [4,4] results from connectivity of instances in function C with instances in function D. Here, there are four such instance connections. Taking instance 1903 in function D as the SI, where instance D has a bit# of 4 in function D, and function D itself is offset at 0, because it is also a tallest function in the region:

(0+4)–(0)=4.

Here, then the relative offset between function C and function D based on connectivity is 4. As there are four instances that share this relative offset, this bit offset is incremented four times.

Likewise, function B will have a range R[B]={ [8,8] }, since there are eight instances coupling B to A each with a relative offset of 8.

If the determined bit offset is not already in a pair [bit offset, connectivity weight] that is a member of R of the destination function DF, or R[DF], then the function preprocessor 250 creates a new such pair in R[DF]. In any event, the function preprocessor 250 then increments 1807 the connectivity weight by 1.

When all logic cell instances DI have been processed, there will be in set R[DF] a number of [bit offset, connectivity weight] pairs that are connectivity weight to reflect the current connectivity to the source function SF. Each time an instance SI in SF is connected to some instance DI in another datapath function DF, the connectivity weight of the bit offset of DF is updated to reflect that connection. As more and more instances DF are traversed, this set R[DF] of [bit offset, connectivity weights] pair will be completed.

Eventually, when all instances SI in all fixed functions SF have been traversed (1803), there will be a set of ranged functions, each with a set R of {[bit offset, connectivity weight]$^n$} pairs. At this point all datapath functions are either fixed or ranged, and none remain unknown.

Finally, the function preprocessor 250 traverses 1809 all of the ranged functions, those having sets R with more than one [bit offset, connectivity weight] pair. The function preprocessor 250 removes 1810 the [bit offset, weight] pairs that have connectivity weights that fall below a threshold percentage of all connectivity weight values in the datapath function. For example, if the highest connectivity weight for the datapath function is 100, with a bit offset of 5, ie. [5,100], meaning that that bit offset was "chosen" by 100 instances in other fixed functions, then a threshold of 10% would remove all (bit offset, connectivity weight) pairs where the connectivity weight<10. This step heuristically prunes the number of [bit offset, connectivity weight] pairs that are available for later fixing the actual bit offset of the function by the datapath placer 130. Experimentally, it is has been determined that the number of [bit offset, connectivity weight] pairs that are useful to the datapath placer 130 is about 4. For each function, the remaining (bit offset, connectivity weight) pairs are ranked 1811 in descending order by their connectivity weights. When all ranged functions have been pruned and ranked, the function preprocessor 250 returns control to the datapath placer 130.

Figure 19B:
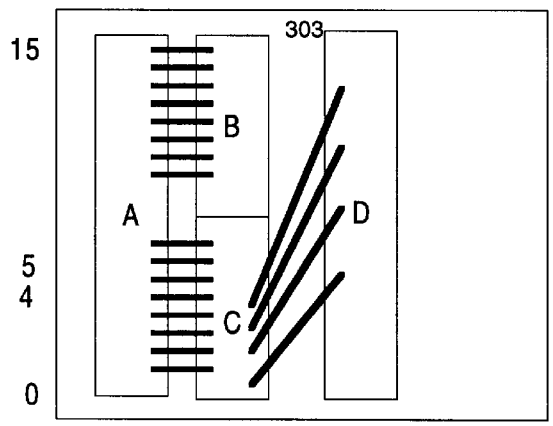
FIG. 19b illustrates the datapath region of FIG. 19a with the ability to stack functions using the bit offset information, and 19c illustrates the datapath region without the ability to stack functions using the bit offset information.
Figure 19C:
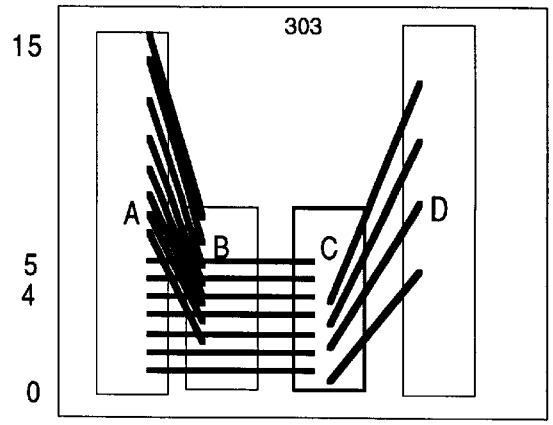

FIG. 19b illustrates the placement of the datapath region 303 that results from the function stacking using the bit offset information developed by the function preprocessor 250. In contrast, FIG. 19c illustrates the placement that would result in a conventional placement that does not provide for the determination of bit offsets for datapath functions themselves and thereby does not provide for function stacking.

Datapath Function Ordering

Once the function preprocessing is completed, the datapath placer 130 then orders the datapath functions 309 in the datapath region 303, using the ranked set R of each datapath function 309 to determine the linear ordering and bit offset of the function. More specifically, function ordering by the A* processor 251 determines the linear order of the datapath functions 309 within the datapath region 303 and determines for each of the datapath functions 309 one of the available bit offsets from the set R of [bit offset, connectivity weight] pairs. Concurrently with this process, routing space estimation is provided by the routing space estimator 140. Once the ordering of each datapath function and its bit offset is known, and the routing space estimation for the entire datapath region 303 is determined, then the tiler 257 places the individual logic cell instances in each datapath function 309. Function ordering is determined using a modified A* algorithm 258 in the A* processor 251.

As noted above, generally, an A* algorithm minimizes a cost function on a state space graph. The A* algorithm provides every node in the state with a depth. To reduce the size of the state space graph, an A* algorithm performs two types of pruning of nodes in the graph, depth and breadth. Since nodes in the state space graph that are accessible from a given node are not limited by the algorithm itself, but represent merely a superset of the current node, Cai et al., determined that breadth pruning is most effectively performed by considering from a given node at a given depth (which as noted above corresponds to a set of datapath functions) only those datapath functions that are connected by a net to datapath functions within the current node. Datapath functions that are not connected to one of the datapath functions in the node are not expanded. For example, in FIG. 17, if datapath function B was not connected to datapath function A, then if the A* algorithm is at node A, the node AB would be pruned. Section 4.4.1 of Cai, et al. further explains this modification of A* In addition, Cai et al. control the amount of depth that is searched by fixing the maximum difference that can be searched from the previously seen maximum level. This is Cai's parameter level, discussed in §4.4.2, where the parameter level is fixed to be positive number.

Continued research during the development of the present invention experimentally determined that fixing level for all types of layouts as suggested by Cai produces suboptimal results for many types of layouts. Accordingly, the modified A* algorithm 258 of the present invention, makes the depth limit parameter adaptible automatically as the placement is being determined.

The Cost Functions for the Datapath Placer

As decribed above, each node in the state space graph 256 defines a particular set of datapath functions in the datapath region 303. The path to the node defines the specific ordering of the datapath functions in that node. Each node has a number of paths that can be used to reach it, and hence defines a number of unique orderings of datapath functions in the datapath region. Accordingly, each unique ordering of the datapath functions for a node has cost function associated with it. The modified A* algorithm 258 merely evaluates this cost function, which is externally defined in the cost functions 253–255.

Since each node in the state space graph 256 defines ordering of only a subset of the datapath functions in the datapath region, the A* processor 251 divides a cost function into two components: a first component which is the cost function which is known for the current datapath functions in the current node, and second component which is an estimate for remaining datapath functions in the datapath region, which are nodes that are children of the current node.

In the present datapath placer 130 cost functions applied to the A* algorithm 258 are based on the following definitions:

There are N datapath functions F in a datapath region: $F_i$: F1, F2, . . . Fn.

There are M datapath nets $S_i$, each connecting a subset $<F_i, F_j, \ldots F_k>$ of the datapath functions.

For the datapath region with N datapath functions, there are N! different linear orders L of the datapath functions <F1, F2 . . . Fn>.

In a given linear order L, the various datapath functions F will be connected by the M datapath nets S.

Estimated Wire Length

Figure 20:
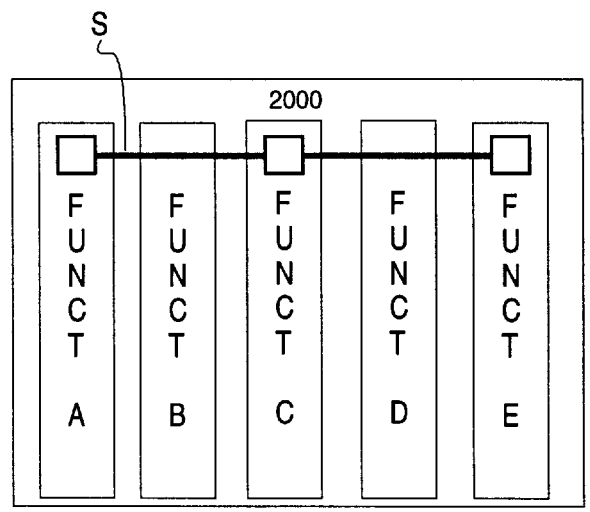
FIG. 20 illustrates the determination of the length of a datapath net for estimating wire length.

Each of these datapath nets S has a length λ. The length λ of a datapath net S, denoted S(λ), is the number of datapath functions that S spans, including datapath functions that are not connected to S. FIG. 20 illustrates this definition. In FIG. 20, in datapath region 2000, datapath net S connects datapath functions A, C, and E, making the subset <A, C, E> of the datapath function of the region. The length λ of S however, is not 3, but rather 5, because S spans datapath functions B and D in between A and E.

Each linear order L has a total wire length T. The total wire length T of linear order L, T(L) is the sum of the lengths λ of all of the nets S for that order. That is:

$$T(L) = \sum_{i=1}^{M} S_i(\lambda)$$

Accordingly, the estimated wire length cost function 253 attempts to find the linear order L of the datapath region with the minimum value of T(L).

The above formulation of the estimated wire length cost function 253 assumes that the width of the datapath functions is unitary, since it defines the length λ of a datapath net S according to the number of spanned functions. Alternatively, the actual width of the functions may be incorporated into the definition of λ, using data from the layout database 195, to provide a more accurate estimate of the estimated wire length.

Estimated Overflow Tracks

Figure 21:
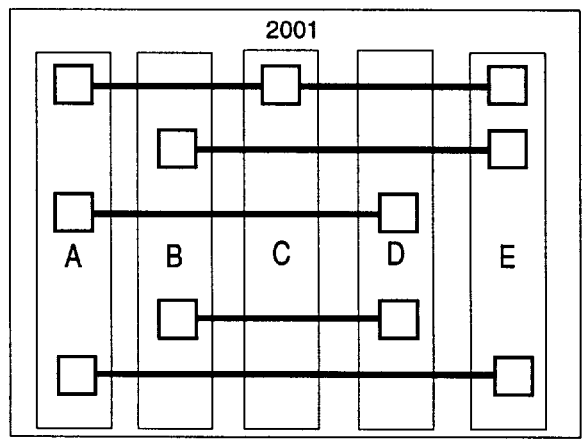
FIG. 21 illustrates the determination of overflow tracks given a linear order of datapath functions in a datapath region.

The estimated overflow track cost function 254 is defined as follows:

A datapath function F has a number of overflow tracks F(O), which is the number of datapath nets S that cross F but that do not connect to it. In FIG. 21, datapath function C has four overflow tracks, datapath function B has one, and datapath function D has three.

For each linear order L then, the estimated overflow tracks of L, L(O), is the maximum of the F(O) of the datapath functions F in L. In FIG. 21, L(O) is four, based on C(O).

Figure 22:
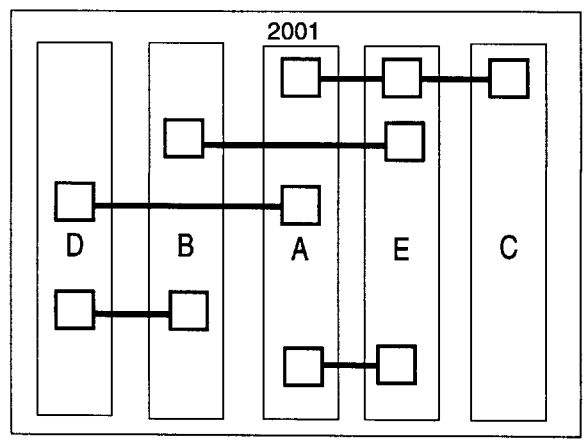
FIG. 22 illustrates the datapath region of FIG. 21 with a different linear order and estimated number of overflow tracks.

Clearly, the number of overflow tracks is determined by the order in L. FIG. 22 is a different linear order L of the functions in FIG. 21. Here, the maximum number of overflow tracks is 1, as found in both functions B and A.

It should be noted that the estimated wire length cost function 253, and the estimated overflow tracks cost function 254 may be opposing cost functions, such that minimizing one increases the other. The A* processor 251 determines the optimal tradeoff between these cost functions given the weighting factors.

Estimated Wasted Area

When the datapath placer 130 completes a placement, there will be some areas of the datapath region in which no datapath functions were placed. This area is the wasted area of the datapath region.

As described above, for each datapath function F, there is a set R[F] of suitable bit offsets. From this set R[F], a single bit offset will be selected as the bit offset of the function F. For each linear order L, each datapath function F in L may be placed at one of the bit offsets in R[F]. The estimated wasted area cost function 255 attempts to select the one linear order L with the bit offset of each function F selected so as to maximize function spacing and minimized wasted area.

Route Estimation

The routing space estimator 140 takes as input a linear order of the datapath functions 309 in a datapath region 303, in which the bit offset of all the datapath functions 309 have been fixed, as described above with respect to datapath function preprocessing. Typically the input will be the linear order as determined by the datapath placer 130, though the routing space estimator 140 may also take a linear order determined by the circuit designer. The routing space estimator 140 then performs global routing of the nets in the datapath region 303 to determine the space required for successful routing of the datapath region 303. The route space estimator 140 determines the estimate of routing space as inter-function space and the inter-bit space.

The routing space estimator 140 determines both inter-function and inter-bit space as the number of routing tracks needed in the appropriate routing layer. Inter-function space is the estimate of vertical space required between datapath functions and for N functions in the datapath region, the inter-function space is a list (N−1) vertical tracks. The first number in the list corresponds to the number of vertical tracks required between first datapath function and the second datapath function in the linear order, and so on for each datapath function and its next adjacent datapath function in the linear order. The inter-bit spacing is the spacing required between adjacent bits is related to the estimated overflow tracks cost function optimized by the datapath placer 130. If the datpath region operates on M global bits, the inter-bit spacing is a list of (M−1) horizontal tracks.

The routing space estimator 140 uses a modified Steiner Tree algorithm as explained in T. Lengauer, *Combinatorial Algorithms for Integrated Circuit Layout*, John Wiley & Sons Ltd., 1990. The modified algorithm operates on a datamodel of the integrated circuit as described above, along with the additional hierachical grouping of nets into databuses. Global routing is first performed at the databus level, instead of the net level. Then the global routing information is propagated to the individual net level for detail routing. This constrains the detail routing of the nets within the databus to be identically routed.

Using the hierarchical data model, the routing space estimator 140 is fast enough to be interactive and used as a floorplanning tool for most practical designs. In contrast, conventional global routers which operate only on a netlist of the lowest level logic cell instances are not interactive, but require significant amounts of time for batch processing of the global routing. Moreover, by performing global routing on data busses and then propagating that information down to the individual nets, rather than on the individual nets itself, the route information obtained for the nets within a data bus is fairly regular across all bits. This is a highly desirable feature in routing complex datapaths because all nets within a databus are identically routed, thereby providing improved timing and other performance characteristics.

Function Tiling

The tiler 257 takes as inputs a linear order of datapath functions 309 within a datapath region 303 in which the bit offsets of the datapath functions 309 have been fixed as described above, and the routing space estimation as determined by route space estimator 140. The tiler 257 produces a detailed placement of all the logic cell instances within each of the datapath functions 309 in the linear order. For any of the datapath functions that corresponds to a tile file 311 that has the irregular property set to "true", making it a random logic function, the tiler 257 does not place the logic cell instances within that datapath function, but instead leaves sufficient space for all the logic cell instances within the datapath function. This space is later filled with logic cell instances of the random datapath function by the incremental standard cell placer 170.

Determining the placement of the logic cell instances within each non-random datapath function in the datapath region corresponds to determining the (X,Y) coordinates of the logic cell instance relative to the origin of the datapath region. The instance information 404 that was present in the tile file 311 (bit# 405, column# 409, and order# 407), and then propogated to the layout database (FIG. 2, create datapath functions 200, and FIG. 2B) is used to determine the placement. The tiler 257 does this by traversing all the datapath functions in the datapath region in the given linear order and using the instance information along with the appropriate inter-function or inter-bit spacing numbers, as determined by the routing space estimator 140 to determine the actual placement of the logic cell instance. In addition, where the stackable attribute of a datapath function is set to false, the tiler 257 will not stack the datapath function over the previous datapath function in the linear order, even if the bit offsets are compatible.

We claim:

1. In a computer aided integrated circuit design system for designing integrated circuits including a plurality of datapath regions, each datapath region including at least one datapath function, each datapath function including at least one logic cell instance, a computer memory readable by a processor in the system for determining a placement of cell instances in a datapath function from a netlist of logic cell instances for the datapath function, comprising:

a first structured description of the unique relative vertical or horizontal placement of logic cell instances in a datapath function, having a plurality of instance descriptions, each instance description including:

i) an instance identifier specifying a logic cell instance;

ii) a bit identifier specifying a bit position in the datapath function relative to a first bit position in the datapath function; and, iii) an order identifier specifying a serial position of the logic cell instance within the specified bit position, and relative to a first serial position of other logic cell instances also assigned to the bit position.

2. The computer memory of claim 1, wherein each order identifier further comprises:

iii.1) a column identifier specifying a column within the datapath function in which the logic cell instance is located; and, iii.2) a column-specific order identifier specifying a serial position of the logic cell instance within the specified column.

3. The computer memory of claim 1, further comprising:

a second structured description associated with a selected datapath region, and including for the selected datapath region an identification of a first structured description for each unique datapath function within the datapath region.

4. A computer implemented method of placing a plurality of datapath functions in a datapath region, the method comprising:

receiving a netlist of cell instances for a plurality of datapath functions in the datapath region;

receiving for each unique datapath function in the datapath region a data file describing for the datapath function a unique relative horizontal and vertical placement of each cell instance in the datapath function;

for each datapath function, associating the datapath function with one of the data files to define the relative placement of each cell instance in the datapath function; and, determining the physical placement of all datapath functions in the datapath region according to the relative placement information associated with datapath function.

5. The computer implemented method of claim 4, wherein determining the physical placement of all datapath functions comprises:

determining at least one linear order of the datapath functions;

determining for each linear order a placement cost determined by a weighted combination of cost functions; and, selecting the linear order of datapath functions that minimizes the placement cost.

6. The method of claim 5, further comprising:

determining for each datapath function in the datapath region a range of suitable bit offsets from an origin of the datapath region for vertically placing the datapath function.

7. The method of claim 6, wherein determining for each datapath function in the datapath region a range of suitable bit offsets comprises:

determining a set of (bit offset, connectivity weight) pairs, where the bit offset is a vertical offset of the datapath function from the origin of the datapath region, and the connectivity weight is a function of a number of other datapath functions that may be coupled to the datapath function at the bit offset.

8. The method of claim 6, wherein weighted combination of cost functions comprise:
   an estimated wire length cost function;
   an estimated wasted area cost function; and,
   an estimated overflow track cost function.

9. The method of claim 8, wherein determining at least one linear order of the datapath functions comprises selecting from the range of bit offsets a bit offset for vertically placing the datapath function that minimizes the estimated wasted area cost function by vertically stacking the datapath function over at least one other datapath function.

10. The computer implemented method of claim 4, wherein the data file includes an instance description for each cell instance in the datapath function, each instance description including:
   i) an instance identifier specifying a logic cell instance;
   ii) a bit identifier specifying a bit position in the datapath function relative to a first bit position in the datapath function; and,
   iii) an order identifier specifying a serial position of the logic cell instance within the specified bit position, and relative to a first serial position of other logic cell instances also assigned to the bit position.

11. A computer implemented method for designing an integrated circuit in a computer aided design system, comprising:
   creating a plurality of datapath functions, each datapath function including a plurality of logic cell instances, each logic cell instance having unique relative horizontal or vertical placement information within the datapath function;
   creating at least one datapath region, and assigning to each datapath region:
      i) an origin within the integrated circuit, and
      ii) selected ones of the plurality of datapath functions; and
   for each datapath region, placing each of the selected ones of the datapath functions and the logic cell instances therein using the relative placement information for the datapath function.

12. The computer implemented method of claim 11, further comprising:
   for each datapath region, estimating an available space for routing each datapath function within the region using the relative placement information for the datapath function.

13. The computer implemented method of claim 11, wherein creating a plurality of datapath functions comprises:
   providing for each of a plurality of unique datapath functions, a structured description of the unique relative vertical or horizontal placement of logic cell instances in the datapath function, having a plurality of instance descriptions, each instance description including:
      i) an instance identifier specifying a logic cell instance;
      ii) a bit identifier specifying a bit position in the datapath function relative to a first bit position in the datapath function; and,
      iii) an order identifier specifying a serial position of the logic cell instance within the specified bit position, and relative to a first serial position of other logic cell instances also assigned to the bit position;
   reading a netlist for the integrated circuit and associating each logic cell instance in the netlist with one of the structured descriptions to establish at least one datapath function including selected logic cell instances;
   for each datapath function, associating the relative placement information to each logic cell instance in the datapath function.

14. The computer implemented method of claim 11, wherein creating at least one datapath region comprises for each datapath region:
   assigning a location of a $0^{th}$ bit of the datapath region relative to a top or bottom of the datapath region; and,
   specifying whether rows within the datapath region are flipped during placement.

15. The computer implemented method of claim 11, further comprising:
   creating in at least one datapath region a cluster and assigning to the cluster selected ones of the datapath functions or other clusters within the datapath region, such that all datapath functions assigned to a cluster are placed within the datapath region as a group relative to all other datapath functions within the datapath region.

16. The computer implemented method of claim 15, wherein each cluster is either i) ordered such that the ordering of datapath functions within the cluster is fixed, or ii) unordered such that the ordering of datapath functions within the cluster is determined during placement.

17. The computer implemented method of claim 11, further comprising for at least one datapath region:
   determining each net that exits the datapath region by coupling a datapath function in the datapath region to a circuit element external to the datapath region;
   for each net that exits the datapath region, automatically assigning a net exit value identifying a side of the datapath region on which the net is to exit the datapath region according to the relative placement of the datapath region to other datapath regions within the circuit.

18. The computer implemented method of claim 11, further comprising for each datapath region:
   assigning a number of rows per bit within datapath region to interleave the datapath functions within the datapath region.

19. The computer implemented method of claim 11, further comprising:
   specifying for at least one datapath function in at least one datapath region that the datapath function comprises random logic, such that all other datapath functions in the datapath region are placed first and then all logic cell instances within the at least one datapath function are placed in a space remaining within the datapath region.

20. The computer implemented method of claim 11, wherein placing each datapath function comprises:
   determining for the datapath function in the datapath region a range of suitable bit offsets from an origin of the datapath region for vertically placing the datapath function; and,
   selecting from the range of bit offsets a bit offset for vertically placing the datapath function that minimizes an estimated wasted area cost function by vertically stacking the datapath function over at least one other datapath function.

21. The method of claim 20, wherein determining for each datapath function in the datapath region a range of suitable bit offsets comprises:

determining a set of (bit offset, connectivity weight) pairs, where the bit offset is a vertical offset of the datapath function from the origin of the datapath region, and the connectivity weight is a function of a number of other datapath functions that may be coupled to the datapath function at the bit offset.

22. A computer aided system for designing an integrated circuit including at least one datapath region having a plurality of datapath functions, comprising:

a) a database storing information for a plurality of logic cell instances;

b) a plurality of tile files, each tile file describing for a unique datapath function in the integrated circuit unique relative placement information for each of the logic cell instances within the datapath function;

c) a tile file list file associating each datapath function within a datapath region within the integrated circuit with one of the plurality of tile files;

d) a datapath floorplanner that is coupled to the database and that receives therefrom the logic cell instance, tile files and tile file list file, and instantiates within the database at least one datapath region, each datapath region having a plurality of instantiated datapath functions, each datapath function instantiated from the tile file associated in the tile file list file with the datapath function, with each logic cell instance within each instantiated datapath function having relative placement information from the tile file.

23. The computer system of claim 22, further comprising:

a datapath placer that is coupled to the database to receive the instantiated datapath functions, and that places each instantiated datapath function within a datapath region according to the relative placement information contained therein and a weighted combination of a plurality of cost functions.

24. The computer system of claim 23, wherein the datapath placer determines for each datapath function in the datapath region a range of suitable bit offsets from an origin of the datapath region for vertically placing the datapath function.

25. The computer system of claim 24, wherein the datapath placer determines for each datapath function in the datapath region a set of (bit offset, connectivity weight) pairs, where the bit offset is a vertical offset of the datapath function from the origin of the datapath region, and the connectivity weight is a function of a number of other datapath functions that may be coupled to the datapath function at the bit offset.

26. The computer system of claim 25, wherein the weighted combination of cost functions used by the datapath placer comprise:

an estimated wire length cost function;

an estimated wasted area cost function; and, an estimated overflow track cost function.

27. The computer system of claim 26, wherein the datapath placer vertically places a datapath function by selecting from the range of bit offsets a bit offset that minimizes the estimated wasted area cost function by vertically stacking the datapath function over at least one other datapath function.

28. The computer system of claim 23, further comprising:

a routing space estimator that is coupled to the database to receive the datapath functions placed within a datapath region, and that estimates an available routing space within the datapath region for routing the logic cell instances within the datapath region according to the placement of datapath functions therein by the datapath placer, and relative vertical and horizontal placement information of the logic cell instances within each datapath function.

29. A computer implemented method for determining a placement of logic cell instances in an integrated circuit, comprising:

a) associating selected logic cell instances with datapath functions, such that some random logic cell instances remain unassociated with any datapath function;

b) placing the datapath functions in a datapath region;

c) within each datapath function, placing the logic cell instances associated with the datapath function within the datapath function;

d) placing selected ones of remaining random logic cell instances in any remaining area within the datapath region where no logic cell instance associated with the datapath function was placed.

30. The computer implemented method of claim 29, wherein placing datapath functions in the datapath region comprises:

determining a linear order and a vertical placement of each datapath function within the datapath region by simultaneously optimizing:

i) an estimated wire length cost function that estimates a wire length needed to route a linear order of the datapath functions;

ii) an estimated overflow track cost function that estimates a number of overflow tracks required to route a linear order of the datapath functions; and, iii) an estimated wasted area cost function that estimates the remaining area within the datapath region resulting from a linear order and vertical placement of each of the datapath functions.

31. The computer implemented method of claim 30, further comprising:

determining for the datapath function in the datapath region a range of suitable bit offsets from an origin of the datapath region for vertically placing the datapath function; and, selecting from the range of bit offsets a bit offset for vertically placing the datapath function that minimizes the estimated wasted area cost function by vertically stacking the datapath function over at least one other datapath function.

* * * * *